(12) United States Patent
Hwang et al.

(10) Patent No.: US 7,978,532 B2
(45) Date of Patent: Jul. 12, 2011

(54) ERASE METHOD OF FLASH MEMORY DEVICE

(75) Inventors: Kyung Pil Hwang, Seoul (KR); Hyung Seok Kim, Seoul (KR); Keum Hwan Noh, Seoul (KR); Ju In Kim, Incheon-si (KR); Min Kyu Lee, Icheon-si (KR); Seok Jin Joo, Seoul (KR); Sook Kyung Kim, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/424,984

(22) Filed: Apr. 16, 2009

(65) Prior Publication Data

US 2009/0201728 A1 Aug. 13, 2009

Related U.S. Application Data

(62) Division of application No. 11/275,279, filed on Dec. 21, 2005, now Pat. No. 7,539,057.

(30) Foreign Application Priority Data

Sep. 15, 2005 (KR) .................. 10-2005-0086201

(51) Int. Cl.
*G11C 16/06* (2006.01)
*G11C 16/14* (2006.01)
*G11C 16/10* (2006.01)

(52) U.S. Cl. .......... 365/185.29; 365/185.03; 365/185.3; 365/185.24

(58) Field of Classification Search ............. 365/185.03, 365/185.29, 185.24, 185.3
See application file for complete search history.

(56) References Cited

U.S. PATENT DOCUMENTS

| 5,440,505 | A | 8/1995 | Fazio et al. |
| 5,677,869 | A | 10/1997 | Fazio et al. |
| 5,805,501 | A | 9/1998 | Shiau et al. |
| 5,894,435 | A | 4/1999 | Nobukata |
| 5,903,495 | A | 5/1999 | Takeuchi et al. |
| 6,236,609 | B1 * | 5/2001 | Tanzawa et al. ............... 365/218 |
| 6,243,290 | B1 | 6/2001 | Kurata et al. |
| 6,343,033 | B1 | 1/2002 | Parker |
| 6,392,931 | B1 | 5/2002 | Pasotti et al. |
| 6,522,580 | B2 | 2/2003 | Chen et al. |
| 6,657,897 | B2 * | 12/2003 | Watanabe et al. ......... 365/185.29 |
| 7,110,300 | B2 | 9/2006 | Visconti |
| 7,251,158 | B2 * | 7/2007 | Hsia et al. ................. 365/185.03 |
| 7,656,710 | B1 | 2/2010 | Wong |
| 2002/0015330 | A1* | 2/2002 | Watanabe et al. ......... 365/185.29 |
| 2002/0191444 | A1 | 12/2002 | Gregori et al. |
| 2005/0276120 | A1* | 12/2005 | Hsia et al. ................. 365/185.33 |

FOREIGN PATENT DOCUMENTS

| JP | 10-241388 | 9/1998 |
| JP | 11-110977 | 4/1999 |
| JP | 2004-014086 | 1/2004 |
| KP | 10-1998-087197 | 12/1998 |
| WO | WO-2005/038815 | 4/2005 |

* cited by examiner

*Primary Examiner* — J. H. Hur

(57) ABSTRACT

Erase and program methods of a flash memory device including MLCs for increasing the program speed. In the erase method, MLCs are pre-programmed so that a voltage range in which threshold voltages of MLCs are distributed can be reduced. Therefore, a fail occurrence ratio can be reduced when erasing MLCs, the threshold voltage distribution of MLCs can be improved and an overall program time can be shortened in a subsequent program operation.

12 Claims, 34 Drawing Sheets

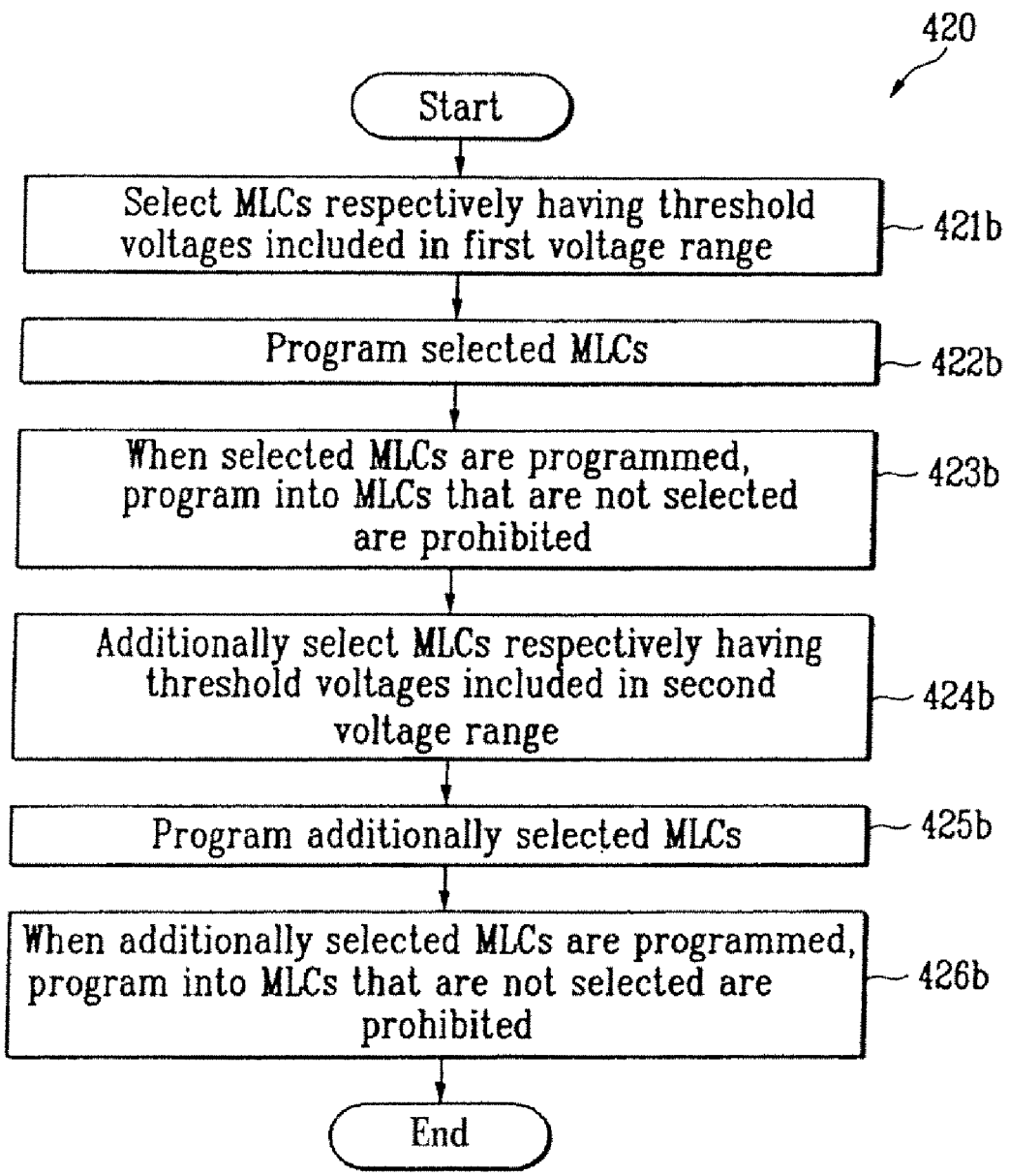

First program cycle  Pth program cycle

ERASE METHOD OF FLASH MEMORY DEVICE

CROSS-REFERENCE TO RELATED APPLICATIONS

This is a division of co-pending, commonly-assigned U.S. application Ser. No. 11/275,279 filed Dec. 21, 2005, which claims the convention priority of Korean application 10-2005-0086201 filed Sep. 15, 2005, the entire respective disclosures of which are incorporated by reference herein.

FIELD OF THE INVENTION

The present invention relates to flash memory devices, and more particularly, to erase and program methods of flash memory devices.

DISCUSSION OF RELATED ART

In general, memory cells of a flash memory device can be classified into a Single-Level Cell (hereinafter referred to as "SLC") and a Multi-Level Cell (hereinafter referred to as "MLC") depending on the number of data bits stored. One (1) bit data having a logic value of "1" or "0" can be stored in the SLC. Two (2) bits data having a logic value of any one of "11", "10", "01" and "00" can be stored in the MLC. Therefore, flash memory devices including MLCs are mainly used for high-integrated semiconductor devices requiring a large capacity of data space.

An erase operation of the flash memory device including MLCs is performed is generally performed on a memory-cell-block basis. The erase operation includes a pre-program process, the erase process and a post program, which are sequentially executed.

The erase operation of the flash memory device including MLCs will now be described in short with reference to FIG. 1. FIG. 1 is a view showing variation in threshold voltages of MLCs depending on the erase process of the flash memory device having MLCs in the related art.

An erase operation of MLCs having threshold voltages distributed as in graphs (G11 to G14) of FIG. 1(*a*) will be first described.

The graph (G11) indicates threshold voltage distribution of the MLCs in which data "11" are stored. The graph (G12) indicates threshold voltage distribution of the MLCs in which data "10" are stored. The graph (G13) designates the threshold voltage distribution of the MLCs in which data "00" are stored. The graph (G14) indicates threshold voltage distribution of the MLCs in which data "01" are stored. The graphs (G1 to G14) exist within a voltage range (W1) defined by voltages (V1 and V2) (i.e., the threshold voltages of the MLCs are distributed within the voltage range (W1)).

If the MLCs having the threshold voltages distributed as shown in the graphs (G11 to G14) are pre-programmed, the threshold voltages of the MLCs are distributed within the voltage range (W2) defined by voltages (V3 and V4), as shown in graphs (G21 to G24) of FIG. 1(*b*). The pre-program process of the MLCs is not executed by a page buffer, but is executed by a circuit that directly discharges a sensing node using a ground voltage on a memory-cell-block basis.

In this case, a width of the voltage range (W2) is narrower than that of the voltage range (W1). This is because MLCs (i.e., the MLCs distributed as in by the graph (G11)), which have a threshold voltage lower than that of MLCs (i.e., the MLCs distributed as in the graph (G14)) having a high threshold voltage, are more programmed and a difference between the threshold voltages of the MLCs becomes narrow as in the graphs (G21 to G24).

Thereafter, if the MLCs having the threshold voltages distributed as shown in the graphs (G21 to G24) are erased, the threshold voltages of the MLCs are distributed within a voltage range (W3), which is defined by voltages (V5 and V6), as shown in graphs (G31 to G34) of FIG. 1(*c*).

If the MLCs are post programmed in order to prevent MLCs from being over erased, the threshold voltages of the MLCs are distributed within a voltage range (W4), which is defined by voltages (V7 and V8), as shown in graphs (G41 to G44) of FIG. 1(*d*). In this case, the threshold voltages of the MLCs must be lower than the voltage (V8).

Therefore, the voltage (V8) is set to a verify voltage, which is applied to a word line in a verify process performed after the post-program process. In the erase process of the flash memory device in the related art, however, the voltage ranges (W2 to W4) in which the threshold voltages of the MLCs are distributed are relatively wide. Therefore, after the erase process, MLCs whose threshold voltage is the same as or higher than the voltage (V8) may exist.

As a result, in the erase process of the flash memory device in the related art, the threshold voltages of the MLCs are relatively widely distributed. Therefore, the probability that fail occurs in the erase process of the MLCs is high. Furthermore, in the erase process of the flash memory device in the related art, MLCs have threshold voltages that are relatively widely distributed (i.e., not having a good threshold voltage distribution). Therefore, a problem arises because an overall program time is increased in a subsequent program process.

Meanwhile, the program operation of a flash memory device including MLCs will be described in short below with reference to FIG. 2. FIG. 2*a* is a view showing variation in a voltage applied to a word line in the program process of the flash memory device having MLCs in the related art. There is shown in FIG. 2 a voltage of a word line, which is varied as the program process of the flash memory device using the Incremental Step Pulse Programming (ISPP) method.

As shown in FIG. 2*a*, the voltage of the word line is increased by a step voltage (Vs) beginning a program voltage (Vpgm1) as a start voltage whenever the number of program cycles increases.

In more detail, in a program period (PGM1), a program voltage (one of Vpgm1 to VpgmJ) (J is an integer) is applied to the word line during a time (P1) and a verify voltage (Vver1) is applied to the word line during a time (F1). The verify voltage (Vver1) is lower than a threshold voltage of a MLC in which data "10" are stored, as shown in FIG. 2*b*.

Furthermore, in a program period (PGM2), a program voltage (one of Vpgm(J+1) to VpgmK) (K is an integer) is applied to the word line during a time (P2) and a verify voltage (Vver2) is applied to the word line during a time (R2). The verify voltage (Vver2) is lower than a threshold voltage of a MLC in which data "00" are stored, as shown in FIG. 2*b*.

In a program period (PGM3), a program voltage (one of Vpgm(K+1) to VpgmL) (L is an integer) is applied to the word line during a time (P3) and a verify voltage (Vver3) is applied to the word line during a time (R3). The verify voltage (Vver3) is lower than a threshold voltage of a MLC in which data "01" are stored, as shown in FIG. 2*b*.

In this case, the relationship between the program voltages (Vpgm1 to VpgmL) can be expressed into the following equation.

$$Vpgm2 = Vpgm1 + Vs,$$

...

...

...

$$VpgmJ = Vpgm(J-1) + Vs,$$

$$Vpgm(J+1) = VpgmJ + Vs,$$

...

...

...

$$VpgmK = Vpgm(K-1) + Vs,$$

$$Vpgm(K+1) = VpgmK + Vs,$$

...

...

...

$$VpgmL = Vpgm(L-1) + Vs,$$

(Vs is a step voltage, J, K, L is an Integer)

As can be seen from the above equation, in the program process according to the ISPP method in the related art, to program MLCs having a threshold voltage lower than a verify voltage (one of Vver1 to Vver3), a program voltage (or a program pulse) that gradually rises by the step voltage (Vs) is repeatedly applied to the word line.

As a result, the greater the number of cells having a low program speed (i.e., slow cells), the greater the number in which the program voltage is applied to the word line (i.e., a program cycle number). If the number of the program cycles increased as described above, a problem arises because an overall program time is increased. This problem also occurs even in a flash memory device having SLCs.

SUMMARY OF THE INVENTION

An advantage of the present invention is that it provides an erase method of a flash memory device, in which it can reduce the fail occurrence ratio when erasing MLCs, improve the threshold voltage distribution of MLCs and reduce an overall program time in a subsequent program operation by performing pre-programming so that a voltage range in which threshold voltages of MLCs are distributed can be reduced.

Another advantage of the present invention is that it provides a program method of a flash memory device, in which only MLCs or SLCs having a slow program speed are selected and programmed wherein the ISPP method is performed for program, so that an overall program time can be reduced.

Further another advantage of the present invention is that it provides a program method of a flash memory device, in which step voltages (i.e., an increment width of a program voltage) before and after threshold voltages of MLCs become a set verify voltage are set to be different from each other in the ISPP method for program, so that an overall program time can be reduced.

According to an aspect of the present invention, there is provided an erase method of a flash memory device including a plurality of MLCs that share word lines and bit lines, including the steps of pre-programming some of the plurality of MLCs so that a range in which threshold voltages of the plurality of MLCs are distributed is reduced, erasing the plurality of MLCs, and verifying whether the plurality of MLCs has been normally erased.

According to another aspect of the present invention, there is provided a program method of a flash memory device including a plurality of memory cells that share word lines and bit lines, including the steps of selecting one of the word lines; programming memory cells connected to the selected word line, of the plurality of memory cells, by applying a start program voltage to the selected word line; selecting memory cells respectively having threshold voltages lower than a predetermined voltage, of the memory cells connected to the selected word line; programming the selected memory cells by applying a pre-program voltage to the selected word line; prohibiting program into the remaining memory cells other than the selected memory cells when the selected memory cells are programmed; and additionally programming the memory cells connected to the selected word line, while supplying a program voltage that gradually rises from the start program voltage at the ratio of the step voltage to the selected word line.

According to further another aspect of the present invention, there is provided a program method of a flash memory device including a plurality of memory cells that share word lines and bit lines, including the steps of selecting one of the word lines; programming memory cells connected to the selected word line by applying a start program voltage that gradually rises at the ratio of a step voltage to the selected word line in each of first to $P^{th}$ (P is an integer) program cycles; selecting memory cells respectively having threshold voltages lower than a predetermined voltage, of the memory cells connected to the selected word line; programming the selected memory cells by applying a pre-program voltage to the selected word line; prohibiting program into the remaining memory cells other than the selected memory cells when the selected memory cells are programmed; and additionally programming the memory cells connected to the selected word line, while supplying a program voltage that gradually rises from the start program voltage that has finally rises in the step of programming the memory cells at the ratio of the step voltage to the selected word line.

According to still another aspect of the present invention, there is provided a program method of a flash memory device including a plurality of MLCs that share word lines and bit lines, including the steps of selecting one of the word lines; first programming the MLCs connected to the selected word line by applying a first program voltage that gradually rises from a start program voltage at the ratio of a first step voltage to the selected word line; and first programming the MLCs connected to the selected word line by applying a second program voltage that gradually rises from the first program voltage, which has finally risen in the first program step, at the ratio of a second step voltage.

BRIEF DESCRIPTION OF THE DRAWINGS

FIG. 2b is a view showing the relationship between verify voltages and threshold voltages of MLCs shown in FIG. 2a;

FIG. 8 is a detailed flowchart illustrating an example of the process (420) shown in FIG. 5;

DETAILED DESCRIPTION OF PREFERRED EMBODIMENTS

The present invention will now be described in connection with preferred embodiments with reference to the accompanying drawings.

Figure 1A:
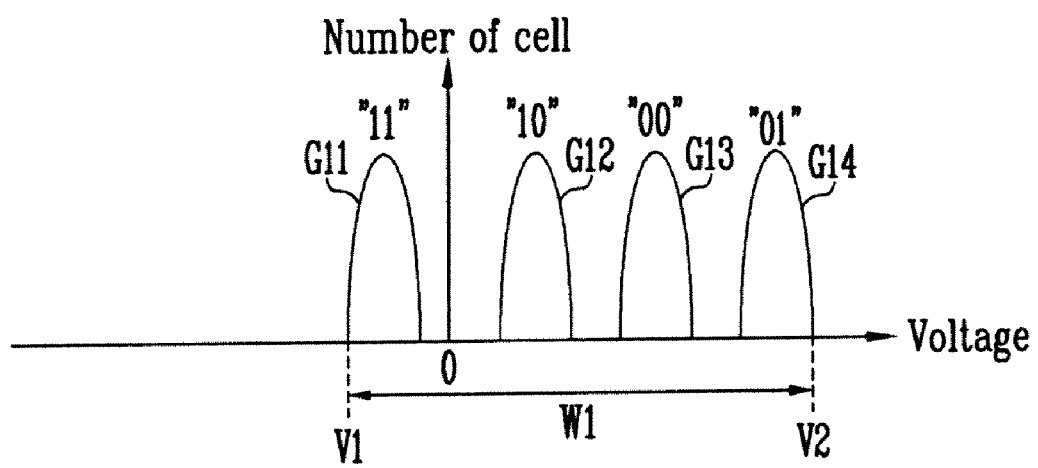
FIG. 1 is a view showing variation in the threshold voltage of MLCs depending on an erase method of a flash memory device having MLCs in the related art.
Figure 1B:
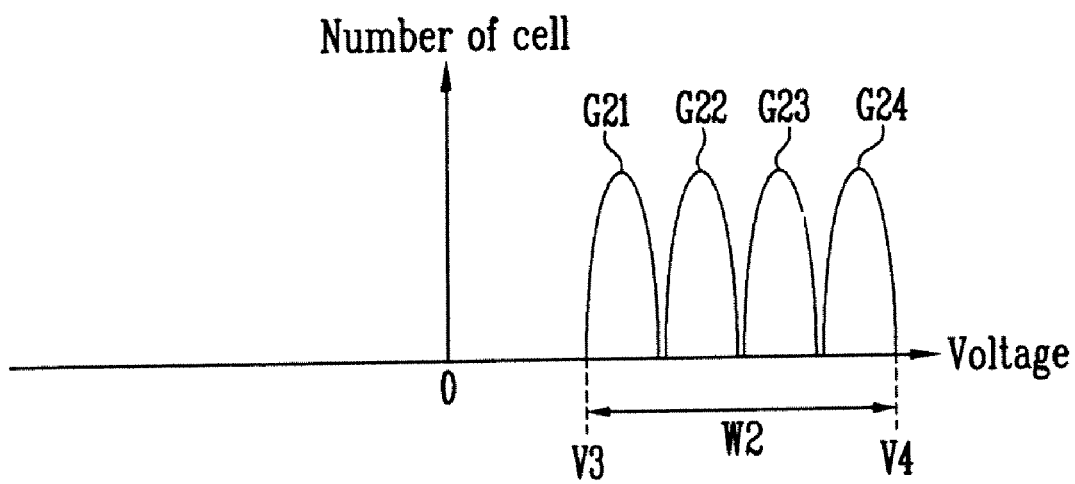
Figure 1C:
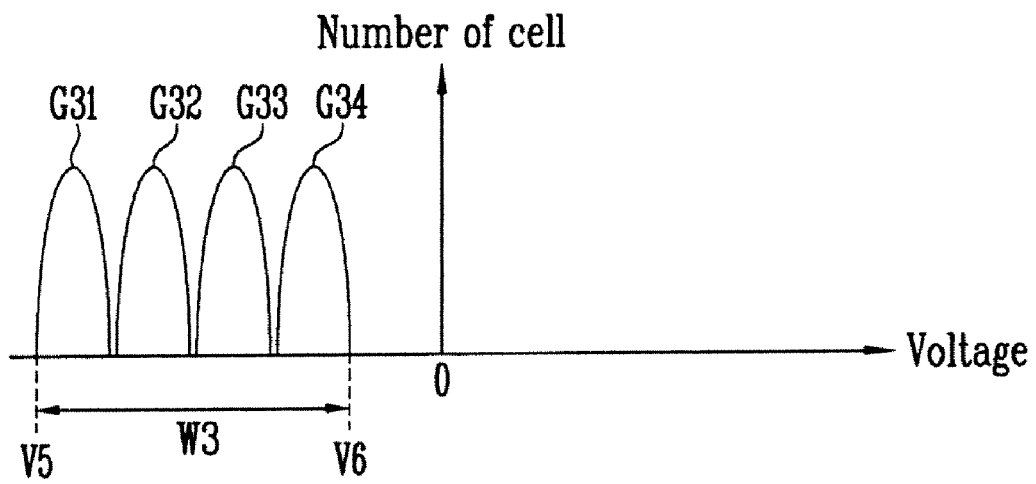
Figure 1D:
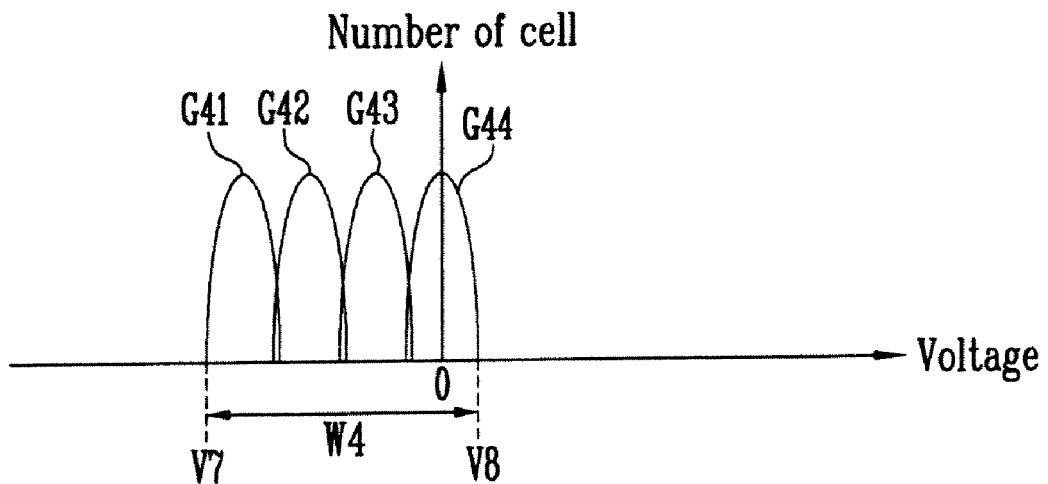
Figure 2A:
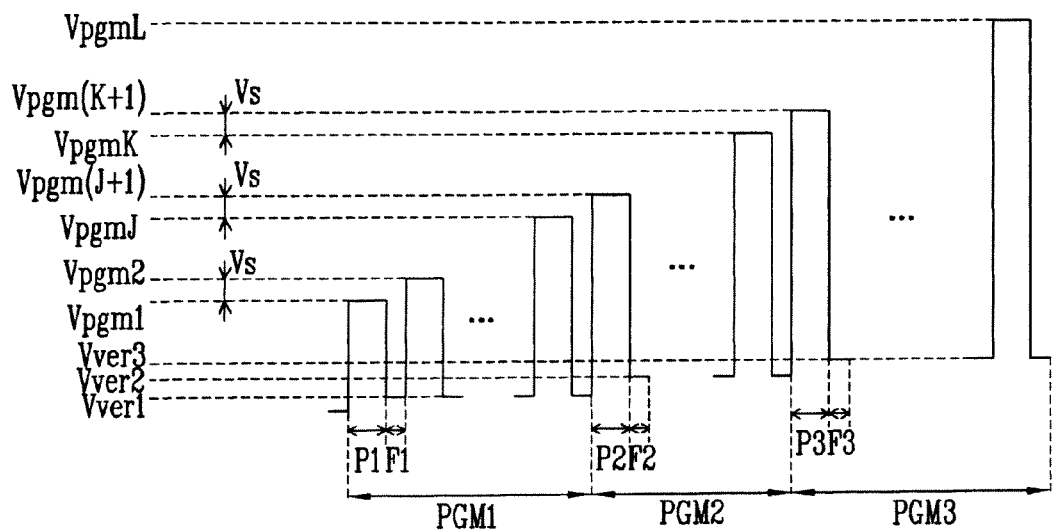
FIG. 2a is a view showing variation in a voltage applied to a word line in a program method of a flash memory device having MLCs in the related art.
Figure 2B:
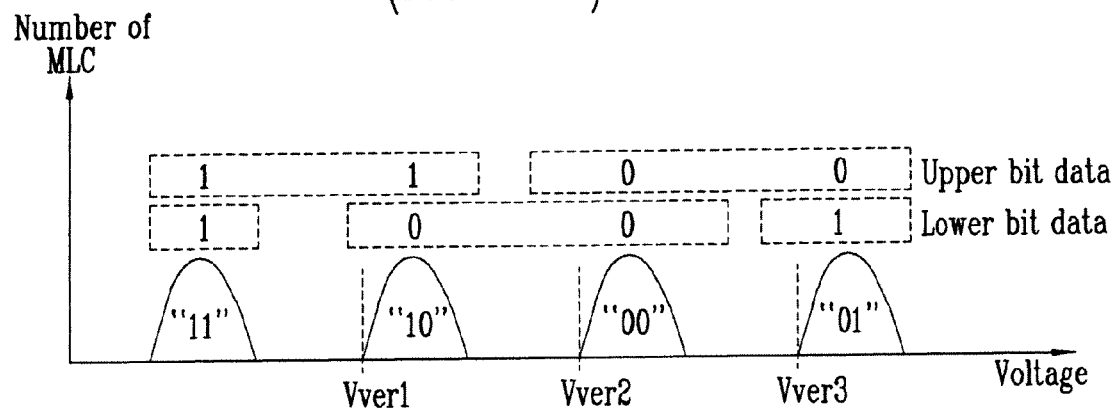
Figure 3:
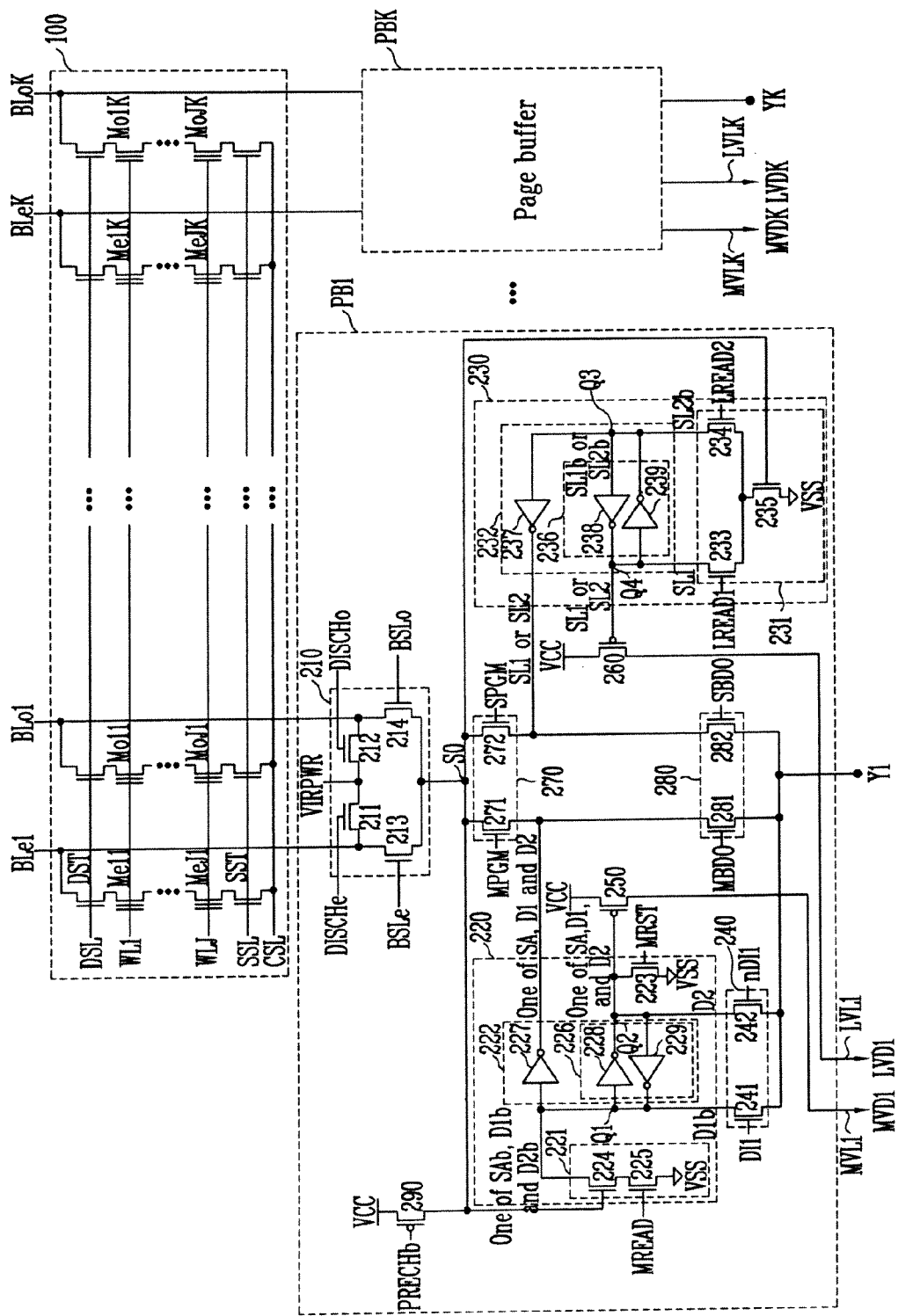
FIG. 3 is a circuit diagram of a page buffer and a memory cell block illustrating the erase and program methods according to an embodiment of the present invention.

FIG. 3 is a circuit diagram of a page buffer and a memory cell block illustrating the erase and program methods according to an embodiment of the present invention.

Referring to FIG. 3, a memory cell block 100 includes memory cells (i.e., MLCs or SLCs) Me11 to MeJK and Mo11 to MoJK (J, K is an integer), drain select transistors DST and source select transistors SST. The MLCs Me11 to MeJK and Mo11 to MoJK have gates connected to word lines WL1 to WLJ, respectively. The MLCs Me11 to Me1K and Mo11 to Mo1K are connected to the drain select transistors DST, respectively. The MLCs MeJ1 to MeJK and MoJ1 to MoJK are connected to the source select transistors SST, respectively. The drain select transistors DST are connected to bit lines BLe1 to BLoK, respectively, one by one. The source select transistors SST are connected to a common source line CSL.

Each of page buffer circuits PB1 to PBK (K is an integer) is connected to a pair of the bit lines BLe1 to BloK. For example, the page buffer circuit PB1 can be connected to the bit lines BLe1, BLo1. The construction and operation of the page buffer circuits PB1 to PBK are the same. Therefore, only the page buffer circuit PB1 will be described as an example.

The page buffer circuit PB1 includes a bit line select circuit 210, an upper bit register 220, a lower bit register 230, a data input circuit 240, a first verify circuit 250, a second verify circuit 260, a data pass circuit 270, a data output circuit 280 and a precharge circuit 290.

The bit line select circuit 210 selects one of the bit lines BLe1, BLo1 in response to bit line select signals (BSLe, BSLo) and discharge signals (DISCHe, DISCHo), and connects the selected bit line BLe1 or BLo1 to a sensing node SO. The bit line select circuit 210 includes NMOS transistors 211 to 214.

The upper bit register 220 includes a sensing circuit 221, a latch circuit 222 and a latch reset circuit 223.

The sensing circuit 221 includes NMOS transistors 224, 225, and it senses a voltage of the sensing node SO in response to a read control signal (MREAD) and generates upper sensing data (SAb) to a node Q1. The latch circuit 222 includes a latch 226 and an inverter 227. The latch 226 latches the upper sensing data (SAb) output to the node Q1 and outputs inverted upper sensing data (SA) to a node Q2. Furthermore, the latch 226 latches input data (D1B or D2) and outputs inverted input data (D1 or D2B) to a node Q2 or Q1. The inverter 227 inverts the upper sensing data (SAb) or the input data (D1B or D2B), which are received from the latch 226 through the node Q1. The latch reset circuit 223 initializes the latch circuit 222 in response to a reset control signal (MRST).

The lower bit register 230 includes a sensing circuit 231 and a latch circuit 232.

The sensing circuit 231 includes NMOS transistors 233 to 235. The sensing circuit 231 senses a voltage of the sensing node SO in response to a read control signal (LREAD1 or LREAD2) and generates lower sensing data (SL1 or SL2b) to a node Q4 or Q3.

The latch circuit 232 includes a latch 236 and an inverter 237. The latch 236 latches the lower sensing data (SL1 or SL2b) and outputs inverted lower sensing data (SL1b or SL2) to the node Q3 or Q4. The inverter 237 receives the inverted lower sensing data (SL1b) or the lower sensing data (SL2b) from the latch 226 through the node Q3 and inverts the received data (SL1b or SL2b).

The data input circuit 240 includes NMOS transistors 241, 242. The data input circuit 240 outputs input data (D1b or D2), which are received through a data I/O node Y1, to the latch 226 of the upper bit register 220 through the node Q1 or Q2, in response to data input signals (DI1, nDI1).

The first verify circuit 250 is connected to the node Q2 and outputs verify data (MVD1) to a data verify line MVL1 in response to one of the inverted upper sensing data (SA), the inverted input data (D1) and the input data (D2), which are received from the latch 226. The first verify circuit 250 can be implemented using a PMOS transistor.

In this case, when received data (one of SA, D1 and D2) are logic "0", the PMOS transistor 250 supplies an internal voltage (VCC) to the data verify line MVL1 and outputs the verify data (MVD1) as logic "1". To the contrary, when the received data (one of SM, D1 and D2) are logic "1", the PMOS transistor 250 does not apply the internal voltage (VCC) to the data verify line MVL1. Therefore, the verify data (MVD1) become logic "0". The data verify line MVL1 is initially set to a ground voltage level.

The second verify circuit 260 is connected to a node Q4 and outputs the verify data (LVD1) to the data verify line LVL1 in response to the inverted lower sensing data (S12) or the lower sensing data (SL1) received from the latch 236. The second verify circuit 260 can be executed as a PMOS transistor.

In this case, when the lower sensing data (SL1) of logic "0" are received, the PMOS transistor 260 applies the internal voltage (VCC) to the data verify line LVL1 and outputs the verify data (LVD1) as logic "1". To the contrary, when the inverted lower sensing data (S12) of logic "1" are received, the PMOS transistor 260 does not apply the internal voltage (VCC) to the data verify line LVL1. Therefore, the verify data (LVD1) become logic "0". The data verify line LVL1 is initially set to the ground voltage level.

The data pass circuit 270 includes NMOS transistors 271, 272. The NMOS transistor 271 outputs the inverted input data (D1) or the input data (D2), which is received from the inverter 227 of the upper bit register 220, to the sensing node SO in response to a transmission control signal (MPGM). The NMOS transistor 272 outputs the inverted lower sensing data (SL2), which are received from the inverter 237 of the lower bit register 230, to the sensing node SO in response to a transmission control signal (SPGM).

The data output circuit 280 includes NMOS transistors 281, 282. The NMOS transistor 281 outputs the inverted upper sensing data (SA) to the data I/O node Y1 in response to a data output signal (MBDO). The NMOS transistor 282 outputs the inverted lower sensing data (SL2) to the data I/O node Y1 in response to a data output signal (SBDO).

The precharge circuit 290 precharges the sensing node SO to the internal voltage (VCC) in response to a precharge control signal (PRECHb).

Figure 4:
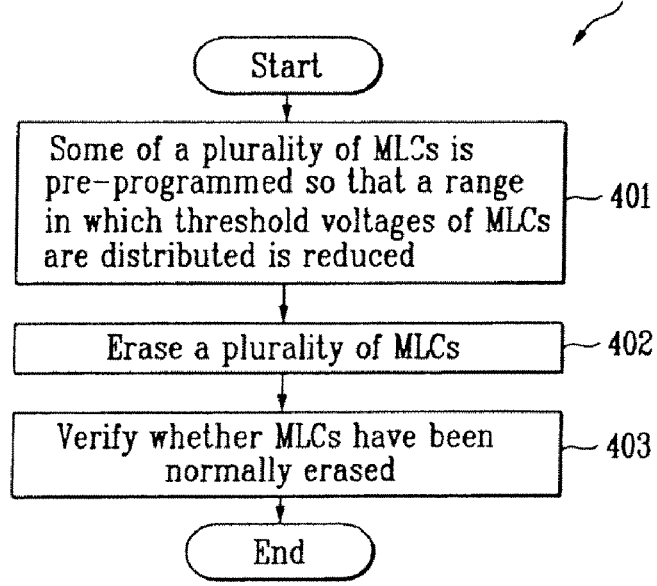
FIG. 4 is a flowchart illustrating the erase method according to an embodiment of the present invention.

The erase method according to an embodiment of the present invention will be described in detail below with reference to FIGS. 4 to 11. FIG. 4 is a flowchart (400) illustrating the erase method according to an embodiment of the present invention.

Some of the MLCs Me11 to MeJK and Mo11 to MoJK are pre-programmed so that the range in which threshold voltages of the MLCs Me11 to MeJK and Mo11 to MoJK are distributed is reduced (401). Thereafter, the MLCs Me11 to MeJK and Mo11 to MoJK are erased (402). The erase process (402) can be understood by those skilled in the art. Description thereof will be omitted. It is verified whether the MLCs Me11 to MeJK and Mo11 to MoJK have been normally erased (403).

Figure 5:
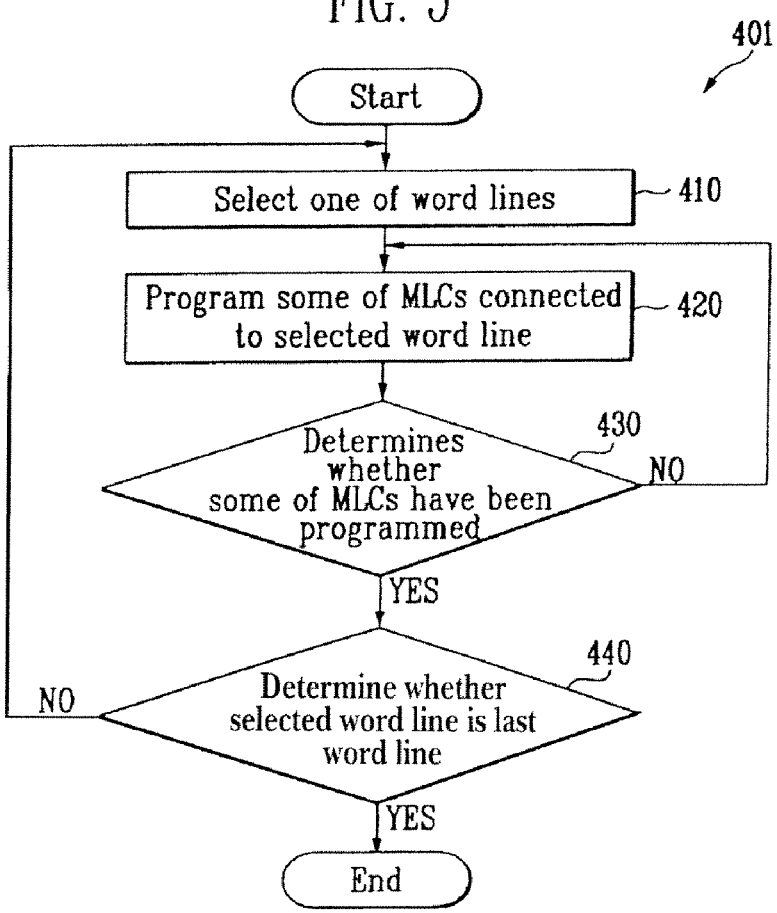
FIG. 5 is a detailed flowchart illustrating the process (401) shown in FIG. 4.

FIG. 5 is a detailed flowchart illustrating the process (401) shown in FIG. 4.

Referring to FIG. 5, one (e.g., WL1) of the word lines WL1 to WLJ is selected (410). A program voltage (not shown) is then applied to the selected word line WL1. The page buffers PB1 to PBK input data for program to some of the bit lines BLe1 to BLeK and BLo1 to BloK and input data for program prohibition to the remaining bit lines.

As a result, some of the MLCs Me1 to Me1K or Mo1 to Mo1K connected to the selected word line WL1 is programmed (420). The step (420) will be described I more detail with reference to FIGS. 6 to 10.

Figure 9A:
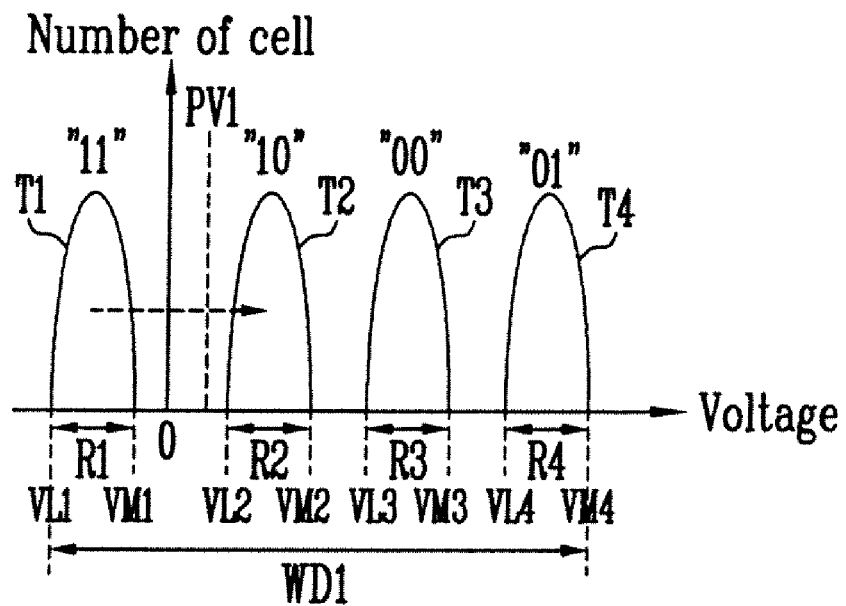
FIGS. 9 and 10 are graphs showing threshold voltage distribution of MLCs, which are varied depending on the erase method according to an embodiment of the present invention.
Figure 9B:
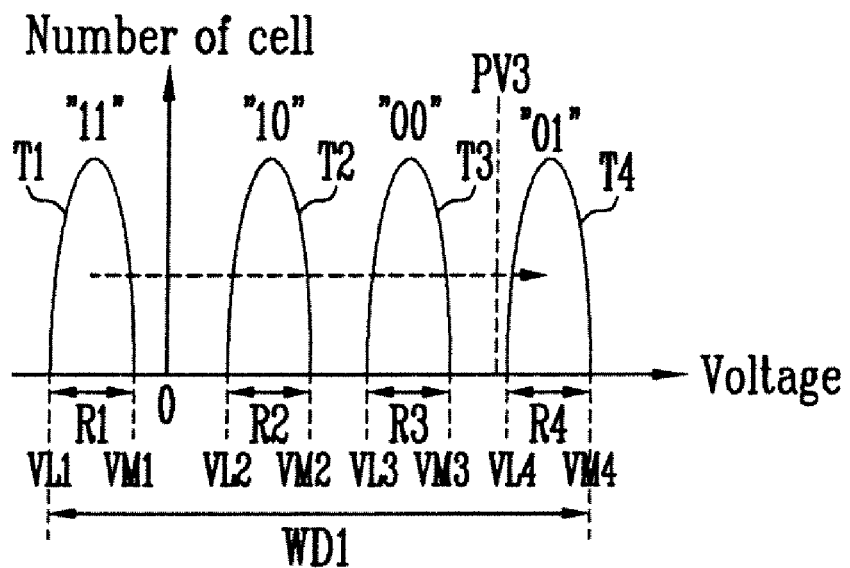

As can be seen from graphs (T1 to T4) in FIG. 9(a) and FIG. 9(b), threshold voltages of the MLCs Me11 to Me1K or Mo11 to Mo1K are included in first to fourth voltage ranges (R1 to R4), respectively.

In this case, the highest voltage (VM1) of the first voltage range (R1) (i.e., a threshold voltage range of MLCs in which data "1" are stored) is lower than the lowest voltage (VL2) of the second voltage range (R2) (i.e., a threshold voltage range of MLCs in which data "10" are stored). The highest voltage (VM2) of the second voltage range (R2) is lower than the lowest voltage (VL3) of the third voltage range (R3) (i.e., a threshold voltage range of MLCs in which data "00" are stored). Furthermore, the highest voltage (VM3) of the third voltage range (R3) is lower than the lowest voltage (VL4) of the fourth voltage range (R4) (i.e., a threshold voltage range of MLCs in which data "01" are stored).

Meanwhile, in the step (420), only MLCs having the threshold voltages included in the first voltage range (R1) can be selected and programmed. In more detail, as indicated by a dotted arrow of FIG. 9 (a), the MLCs can be programmed so that the threshold voltages are moved from the first voltage range (R1) to the second voltage range (R2) (i.e., lower bit data are programmed into the MLCs).

Alternately, as indicated by a dotted arrow of FIG. 9(b), the MLCs can be programmed so that the threshold voltages are moved from the first voltage range (R1) to the fourth voltage range (R4) (i.e., upper bit data are programmed into the MLCs).

Figure 6:
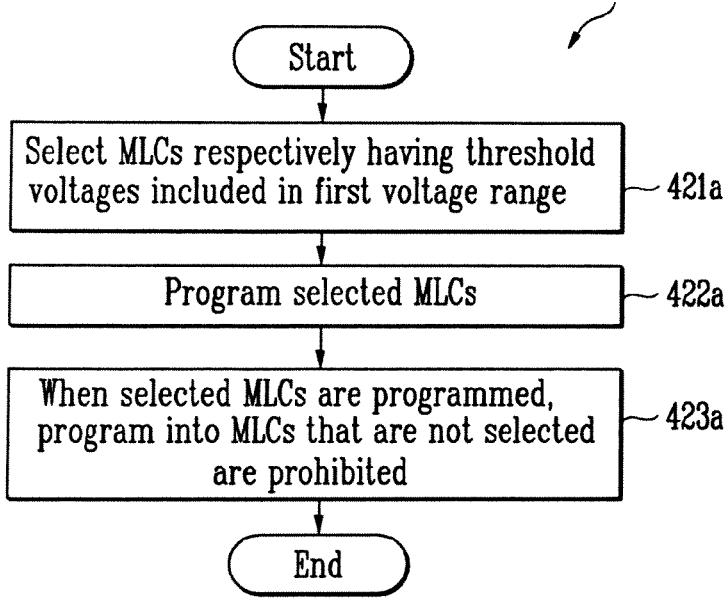
FIG. 6 is a detailed flowchart illustrating the process (420) shown in FIG. 5.
Figure 7:
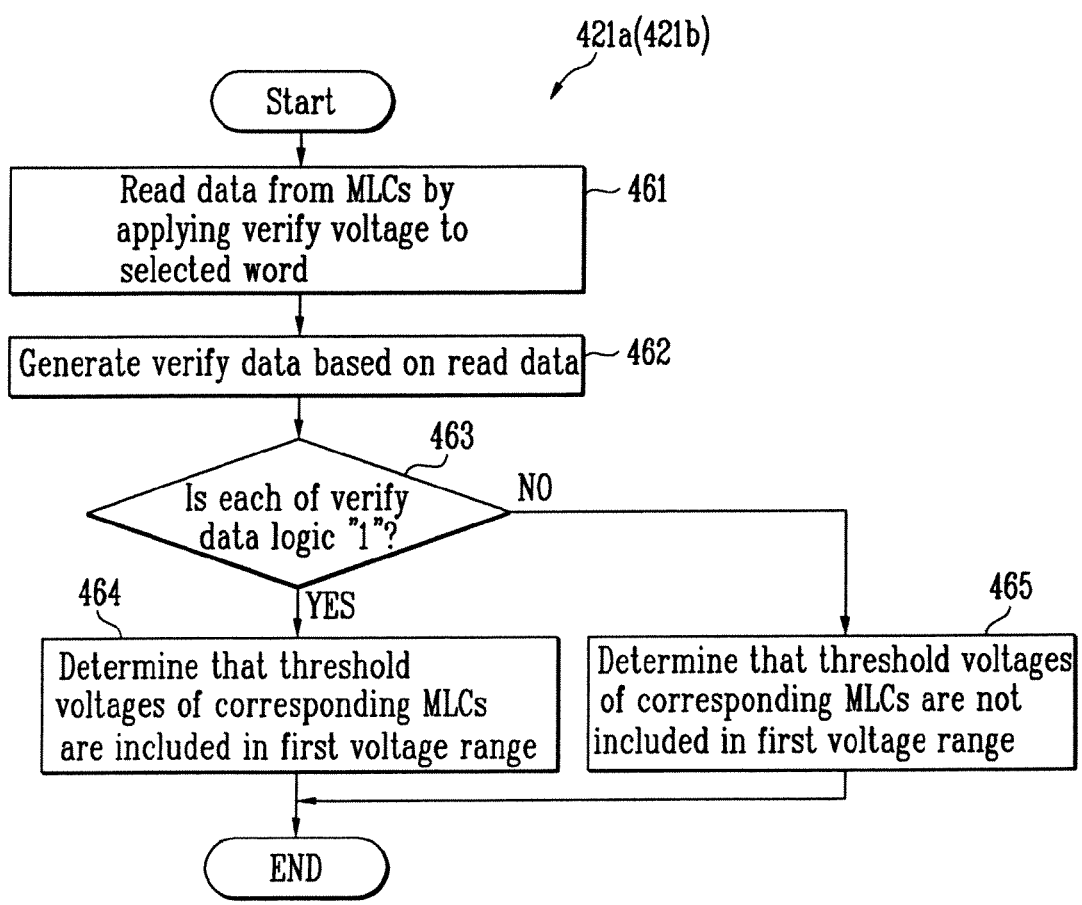
FIG. 7 is a detailed flowchart illustrating the process (421 shown in FIG. 6.

Referring to FIG. 6, MLCs respectively having threshold voltages included in the first voltage range (R1) are selected from the MLCs Me11 to Me1K or Mo11 to Mo1K connected to the selected word line WL1 (421a). The step (421a) will be described in more detail below with reference to FIG. 7.

The lower bit register 230 of each of the page buffers PB1 to PBK senses a voltage (e.g., VCC) of the sensing node SO in response to the read control signal (LREAD1) and stores the lower sensing data (SL1) depending on the sensed result, so that it is initialized.

Thereafter, as the selected word line WL1 is supplied with the verify voltage (refer to PV1 in FIG. 9), data (not shown) are read from the MLCs Me11 to Me1K or Mo11 to Mo1K (461). The page buffers PB1 to PBK generate the verify data (LVD1 to LVDK) based on the read data (462). This will be described in more detail.

The lower bit register 230 of each of the page buffers PB1 to PBK senses a voltage of the sensing node SO, which is decided by each of the read data, in response to the read control signal (LREAD2), and stores the lower sensing data (SL2b) depending on the sensed result.

For example, when the read data are logic "1" (i.e., when a threshold voltage of a corresponding MLC is higher than the verify voltage (PV1)), the lower bit register 230 stores the lower sensing data (SL2b) of logic "0" (i.e., the inverted lower sensing data (SL2) of logic "1").

On the other hand, when the read data are logic "0" (i.e., when a threshold voltage of a corresponding MLC is lower than the verify voltage (PV1)), the lower bit register 230 maintains the storage state (i.e., an initialization state) of the lower sensing data (SL1) of logic "0". The lower sensing data (SL1) of logic "0", which are stored in the lower bit register 230, are used as the program data in a subsequent program step (422a).

The second verify circuit 260 of each of the page buffers PB1 to PBK generates verify data (one of LVD1 to LVDK) in response to the lower sensing data (SL1) or the inverted lower sensing data (SL2) received from the lower bit register 230 (462). For example, the second verify circuit 260 can generate verify data (one of LVD1 to LVDK) of logic "1" in response to the lower sensing data (SL1). The second verify circuit 260 can generate verify data (one of LVD1 to LVDK) of logic "0" in response to the lower sensing data (SL2).

Thereafter, a data compare circuit (not shown) determines whether each of the verify data (LVD1 to LVDK) is logic "1" (463). The data compare circuit determines that MLCs (e.g., Me11 to Me16 or Mo11 to Mo16) corresponding to verify data (e.g., LVD1 to LVD6) of logic "1" have their threshold voltages included in the first voltage range (R1) (464). Furthermore, the data compare circuit determines that MLCs (e.g., Me17 to Me1K or Mo17 to Mo1K) corresponding to verify data (e.g., LVD7 to LVDK), which are not logic "1", have their threshold voltages not included in the first voltage range (R1) (465).

As a result, the MLCs Me11 to Me16 or Mo11 to Mo16 respectively having the threshold voltages included in the first voltage range (R1), of the MLCs Me11 to Me1K or Mo11 to Mo1K, can be filtered.

Referring back to FIG. 6, the selected MLCs Me11 to Me16 or Mo11 to Mo16 are programmed so that the threshold voltages of the selected MLCs Me11 to Me16 or Mo11 to Mo16 are moved from the first voltage range (R1) to the second voltage range (R2) or from the first voltage range (R1) to the fourth voltage range (R4) (422a).

At this time, the word line WL1 is supplied with a program voltage. Each of the page buffers PB1 to PB6 outputs the lower sensing data (SL1) of logic "0", which are stored in the lower bit register 230 in the step (462), to the bit lines BLe11 to BLe16 or BLo11 to BLo16, respectively, as the program data through the sensing node SO in response to the transmission control signal (SPGM).

At this time, a time taken to program the MLCs so that the threshold voltages of the selected MLCs Me11 to Me16 or Mo11 to Mo16 are moved from the first voltage range (R1) to the second voltage range (R2) can be set to be shorter than a time taken to program the MLCs so that the threshold voltages of the selected MLCs Me11 to Me16 or Mo11 to Mo16 are moved from the first voltage range (R1) to the fourth voltage range (R4).

Meanwhile, when the selected MLCs Me11 to Me16 or Mo11 to Mo16 are programmed, program into the MLCs Me17 to Me1K or Mo17 to Mo1K that are not selected are prohibited (423a).

In more detail, each of the page buffers PB7 to PBK outputs the inverted lower sensing data (S12) of logic "1", which are stored in the lower bit register 230 in the step (462), to bit lines BLe17 to BLe1K or BLo17 to BLo1K, respectively, as the program data through the sensing node SO in response to the transmission control signal (SPGM).

Referring back to FIG. 5, it is determined whether some of the MLCs (i.e., the selected MLCs Me11 to Me16 or Mo11 to Mo16) have been programmed (430). Though not shown in FIG. 5 in detail, the step (430) is the same as the step (421a), which has been described with reference to FIG. 7, except for several points.

The steps (430, 421a) differ from each other in that one of the verify voltages (PV1, PV3) is selectively supplied to the word line WL1 in the step (430), and when both the verify data (LVD1 to LVD6 or MVD1 to MVD6) are logic "0", it is determined that the selected MLCs Me11 to Me16 or Mo11 to Mo16 are all programmed.

For example, in the case where the selected MLCs Me11 to Me16 or Mo11 to Mo16 are programmed so that the threshold voltages of the selected MLCs Me11 to Me16 or Mo11 to Mo16 are moved from the first voltage range (R1) to the second voltage range (R2) in the step (420), the verify voltage (PV1) is applied to the word line WL1 in the step (430).

Furthermore, in the case where the selected MLCs Me11 to Me16 or Mo11 to Mo16 are programmed so that the threshold voltages of the selected MLCs Me11 to Me16 or Mo11 to Mo16 are moved from the first voltage range (R1) to the fourth voltage range (R4), the verify voltage (PV3) is applied to the word line WL1 in the step (430).

Thereafter, the steps (420, 430) are repeatedly performed until the selected MLCs Me11 to Me16 or Mo11 to Mo16 are programmed.

Thereafter, it is determined whether the selected word line is a last word line (440). The steps (410 to 440) are repeatedly performed until the selected word line becomes the last word line.

The reason why MLCs connected to the entire word lines are programmed in the pre-program process (401) is that the erase operation of the flash memory device is performed on a memory-cell-block basis. Therefore, the threshold voltages of the MLCs Me11 to Me1K or Mo11 to Mo1K are included in the second to fourth voltage ranges (R2 to R4), respectively, by means of the process (401), as indicated in FIG. 9(c).

Figure 9C:
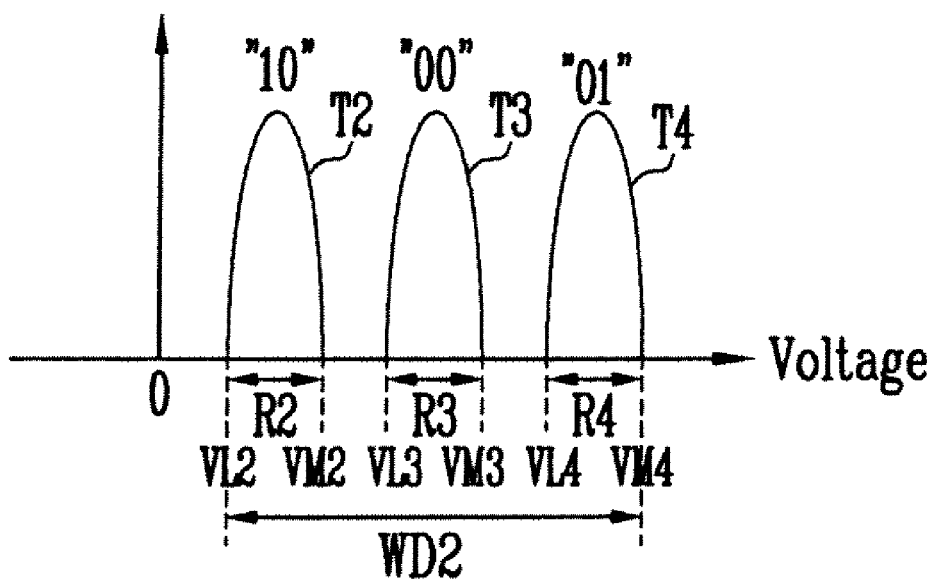

As a result, the entire distribution range (WD2) (refer to FIG. 9(c)) of the threshold voltages of the MLCs Me11 to Me1K or Mo11 to Mo1K after the MLCs are pre-programmed can become narrower than the entire distribution range (WD1) (refer to FIG. 9 (a) and FIG. 9(b)) of the threshold voltages of the MLCs Me11 to Me1K or Mo11 to Mo1K before the MLCs are pre-programmed.

Figure 9D:
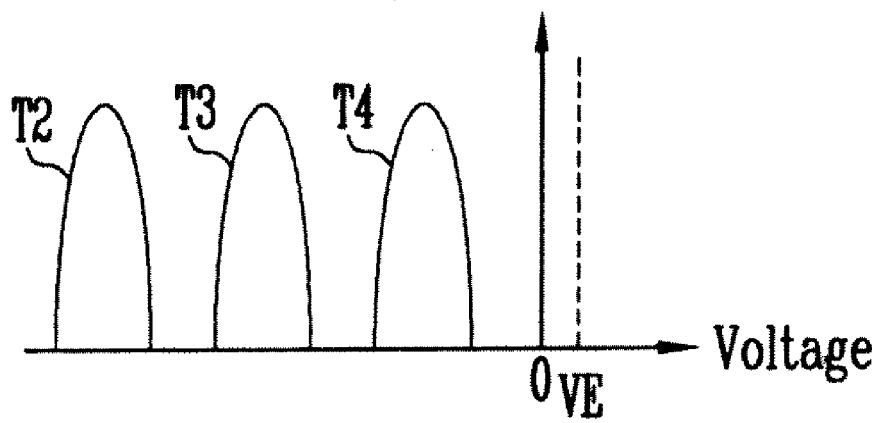

If the entire distribution range of the threshold voltages of the MLCs becomes narrow as described above, the ratio in which fail is generated in the erase process (402) can be reduced because the threshold voltages of the MLCs exist within a voltage range lower than the erase verify voltage (VE) after the erase process (402) as shown in the graphs (T2 to T4) of FIG. 9(d).

Furthermore, in the case where the entire distribution range of threshold voltages of MLCs is narrowed, an overall program time can be shortened in a subsequent program process.

Figure 10A:
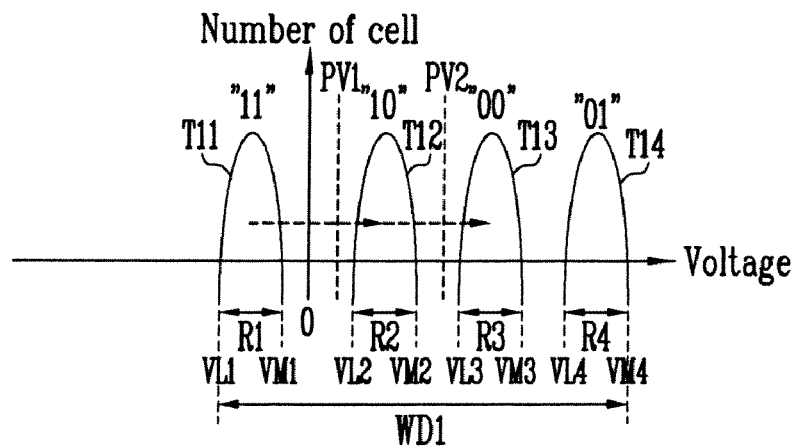
Figure 10B:
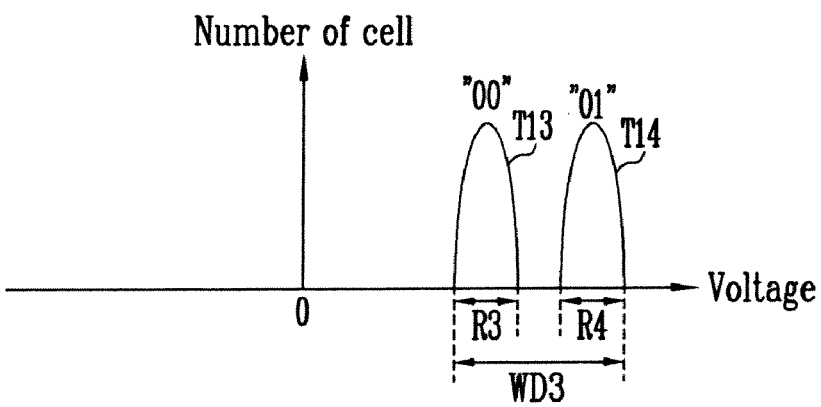
Figure 10C:
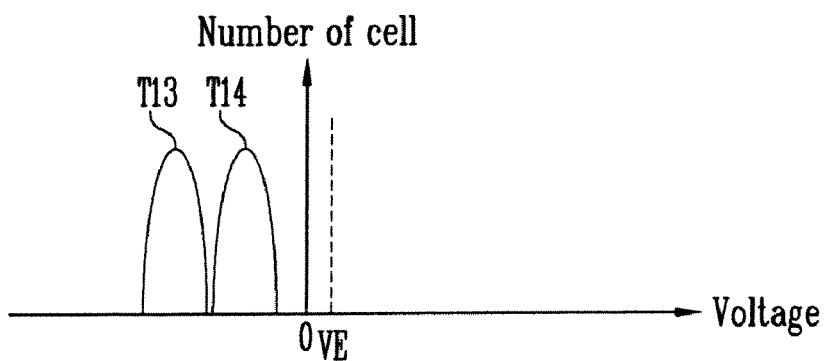

Alternately, the step (420), MLCs can be firstly programmed (i.e., after lower bit data are programmed into the MLCs) so that the threshold voltages of the MLCs are moved from the first voltage range (R1) to the second voltage range (R2) and can be then secondly programmed (i.e., upper bit data are programmed into the MLCs) so that the threshold voltages of the MLCs are moved from the second voltage range (R2) to the third voltage range (R3), as shown in graphs (T11 to T14) of FIG. 10(*a*). This will be described in more detail below with reference to FIG. 8.

FIG. 8 is a detailed flowchart illustrating an example of the process (420) shown in FIG. 5.

MLCs (e.g., Me11 to Me16 or Mo11 to Mo16), each having threshold voltages included in the first voltage range (R1), are selected from the MLCs Me11 to Me1K or Mo11 to Mo1K connected to a selected word line (e.g., WL1) (421*b*).

Thereafter, the selected MLCs Me11 to Me16 or Mo11 to Mo16 are programmed so that threshold voltages of the selected MLCs Me11 to Me16 or Mo11 to Mo16 are moved from the first voltage range (R1) to the second voltage range (R2) (422*b*).

When the selected MLCs Me1 to Me16 or Mo11 to Mo16 are programmed, program into the MLCs Me17 to Me1K or Mo17 to Mo1K that have not been selected is prohibited (423*b*).

The steps (421*b* to 423*b*) are substantially the same as the steps (421*a* to 423*a*), which have been described with reference to FIG. 6. Detailed description thereof will be omitted.

Thereafter, MLCs (e.g., Me11 to Me19 or Mo11 to Mo19), each having threshold voltages included in the second voltage range (R2), are additionally selected from the MLCs Me11 to Me1K or Mo11 to Mo1K (424*b*). The step (424*b*) is the same as the step (421*a*), which has been described with reference to FIG. 7, except for several points.

That is, the step 424*a* is also different from the step 421*a* in that the verify voltage (refer to PV2 in FIG. 10) is applied to the word line WL1. The step 424*a* is also different from the step 421*a* in that the MLCs Me11 to Me19 or Mo11 to Mo19, which correspond to verify data (e.g., LVD1 to LVD9) having logic "1", (i.e., threshold voltages of the MLCs Me11 to Me19 or Mo11 to Mo19 are included in the second voltage range (R2)), are filtered.

The additionally selected MLCs Me11 to Me19 or Mo11 to Mo19 are programmed so that the threshold voltages of the additionally selected MLCs Me11 to Me19 or Mo11 to Mo19 are moved from the second voltage range (R2) to the third voltage range (R3) (425*b*).

When the additionally selected MLCs Me11 to Me19 or Mo11 to Mo19 are programmed, program into the MLCs Me110 to Me1K or Mo110 to Mo1K that have not been selected is prohibited (426*b*). The operation of the page buffers PB1 to PBK in the steps (425*b*, 426*b*) is similar to that of the page buffers PB1 to PBK in the steps (422*a*, 423*a*).

As described above, the threshold voltages of the MLCs Me11 to Me1K or Mo11 to Mo1K are included in the third and fourth voltage ranges (R3, R4), respectively, by means of the step (420), as shown in FIG. 10(*b*). As a result, the entire distribution range (WD3) (refer to FIG. 10(*b*)) of the threshold voltages of the MLCs Me11 to Me1K or Mo11 to Mo1K after the MLCs are pre-programmed can become narrower than the entire distribution range (WD11) (refer to FIG. 10(*a*)) of the threshold voltages of the MLCs Me11 to Me1K or Mo11 to Mo1K before the MLCs are pre-programmed.

Figure 11:
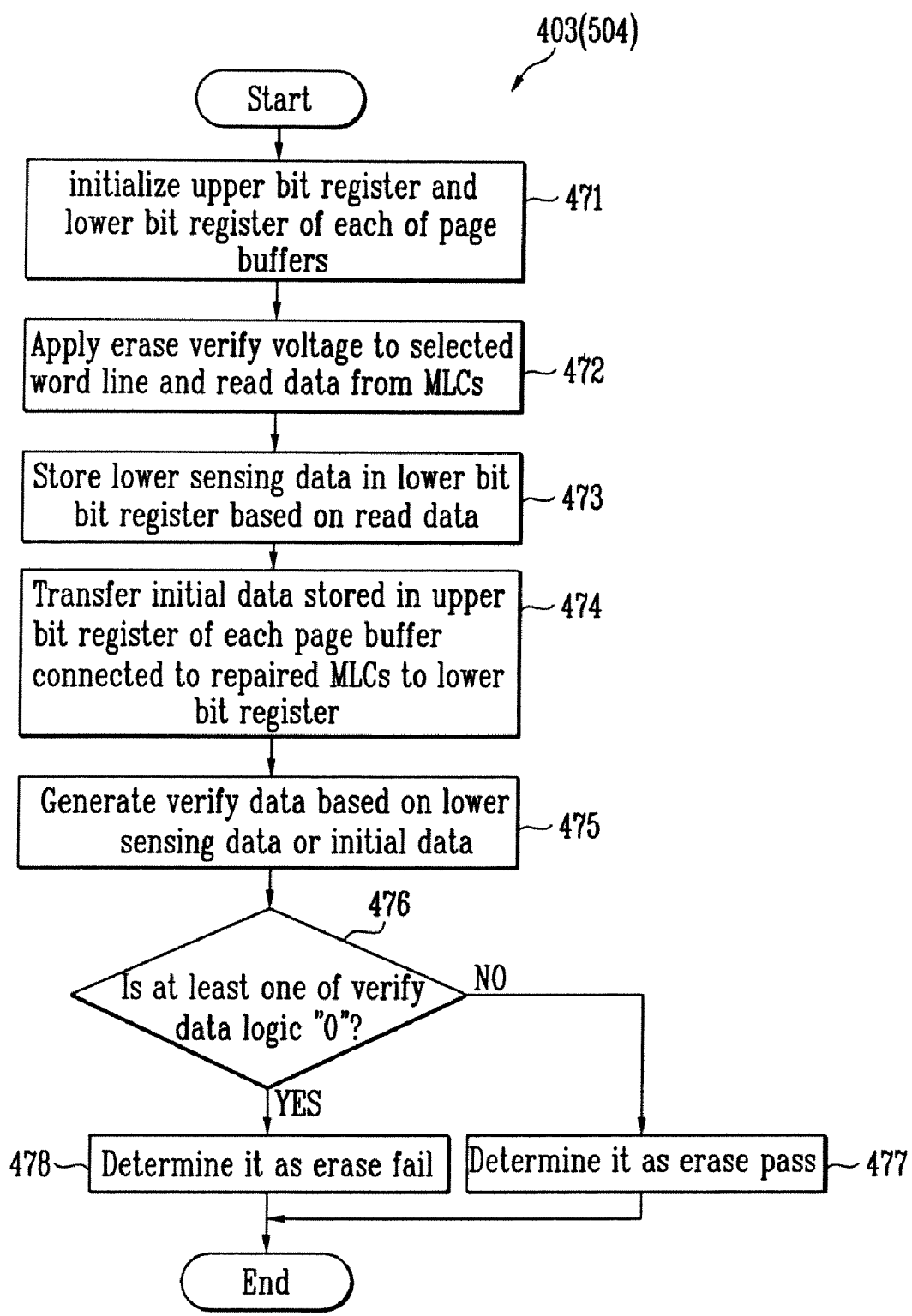
FIG. 11 is a detailed flowchart illustrating the process (403) shown in FIG. 4.

FIG. 11 is a detailed flowchart illustrating the process (403) shown in FIG. 4.

Referring to FIG. 11, the upper bit register 220 and the lower bit register 230 of each of the page buffers PB1 to PBK are initialized in response to the read control signal (MREAD) and the read control signal (LREAD2), respectively (471). As a result, the latch circuit 222 outputs upper sensing data (SA) of logic "1" to the node Q2 and the latch circuit 232 outputs lower sensing data (SL2) of logic "1" to the node Q4. The operation of the page buffers PB1 to PBK in the step (471) can be easily understood by those skilled in the art. Description thereof will be omitted in order to avoid redundancy.

Thereafter, as the erase verify voltage (VE) is applied to the selected word line WL1, data (not shown) are read from the MLCs Me11 to Me1K or Mo11 to Mo1K connected to a selected word line WL1 (472).

The lower bit register 230 of each of the page buffers PB1 to PBK senses a voltage of the sensing node SO, which is decided by each of the read data, in response to the read control signal (LREAD1), and stores the lower sensing data (SL1) depending on the sensing result (473).

For example, when the read data are logic "1" (i.e., a threshold voltage of a corresponding MLC is higher than the erase verify voltage (VE)), the lower bit register 230 can store the lower sensing data (SL1) of logic "0". On the other hand, when the read data are logic "0" (i.e., a threshold voltage of a corresponding MLC is lower than the erase verify voltage (VE)), the lower bit register 230 can maintain the storage state of the inverted lower sensing data (SL2) of logic "1" (i.e., an initialization state).

The data pass circuit 270 of each of the page buffers PB1, PB2, which are connected to repaired MLCs (i.e., fail cells) (e.g., Me11 to Me12 or Mo11 to Mo12) of MLCs Me11 to Me1K or Mo11 to Mo1K connected to the selected word line WL1, transfers the initial data (SA) stored in the upper bit register 220 to the lower bit register 230 in response to the transmission control signal (MPGM) (474).

The lower bit register 230 senses a voltage of the sensing node SO, which is decided by the initial data (SA), in response to the read control signal (LREAD2). The reason why the step (474) is executed is that the verify result on the fail cells Me11 to Me12 or Mo11 to Mo12 is to be determined as a pass unconditionally although the fail cells Me11 to Me12 or Mo11 to Mo12 are not erased in the step (402) because the fail cells Me11 to Me12 or Mo11 to Mo12 have already been repaired by repair memory cells.

The second verify circuit 260 of each of the page buffers PB1 to PBK generates the verify data (LVD1) in response to the inverted lower sensing data (SL2), which is generated based on the lower sensing data (SL1) stored in the lower bit register 230 or the initial data (SA) (475).

For example, the second verify circuit 260 can generate verify data (one of LVD1 to LVDK) of logic "1" in response to the lower sensing data (SL1) and the second verify circuit 260 can generate verify data (one of LVD1 to LVDK) of logic "0" in response to the inverted lower sensing data (SL2).

Thereafter, a data compare circuit (not shown) determines whether at least one of the verify data (LVD1 to LVDK) output from the page buffers PB1 to PBK is logic "1" (476).

If it is determined that at least one of the verify data (LVD1 to LVDK) is logic "1", the erase of the MLCs Me11 to Me1K or Mo11 to Mo1K is determined as a fail (478). Furthermore, when the verify data (LVD1 to LVDK) are all logic "0", it is determined that the erase of the MLCs Me11 to Me1K or Mo11 to Mo1K is a pass (477).

Figure 12:
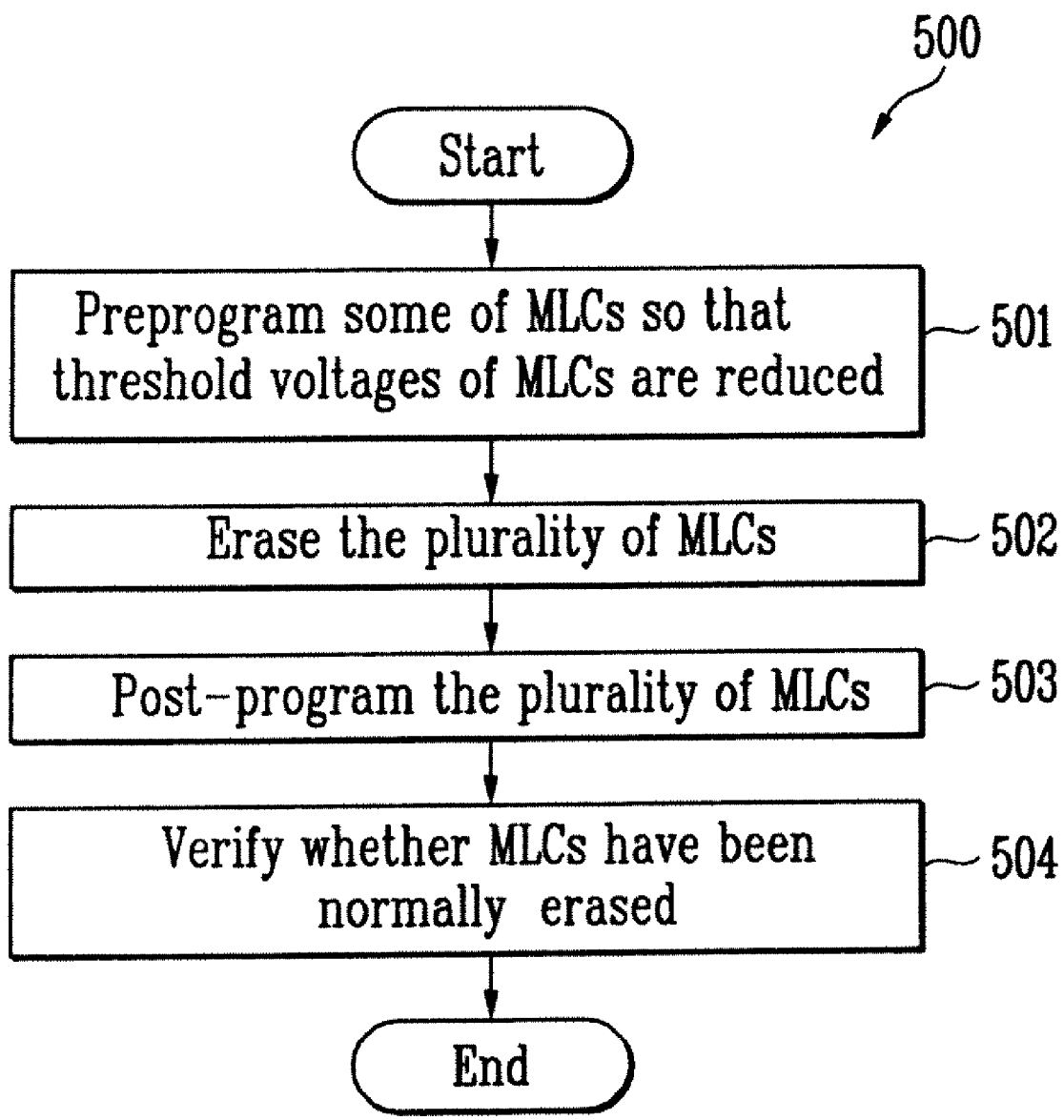
FIG. 12 is a flowchart illustrating an erase method according to another embodiment of the present invention.

FIG. 12 is a flowchart illustrating an erase method (500) according to another embodiment of the present invention.

Some of the MLCs Me11 to MeJK, Mo11 to MoJK are first pre-programmed so that the threshold voltages of the MLCs Me11 to MeJK, Mo11 to MoJK are reduced (501). The MLCs Me11 to MeJK, Mo11 to MoJK are then erased (502). The MLCs Me11 to MeJK, Mo11 to MoJK are post-programmed so that the threshold voltages of the MLCs Me11 to MeJK, Mo11 to MoJK and over-programmed MLCs are included in a predetermined voltage range (503). It is verified whether the MLCs Me11 to MeJK, Mo11 to MoJK have been normally erased (504).

The method (500) is substantially the same as the method (400), which has been described with reference to FIGS. 4 to 11, except for one point. The method (500) is different from the method (400) in that a post program process (503) is further included between the erase process (502) and the verify process (504). Therefore, in the present embodiment, only the post program process (503) will be described.

Figure 13:
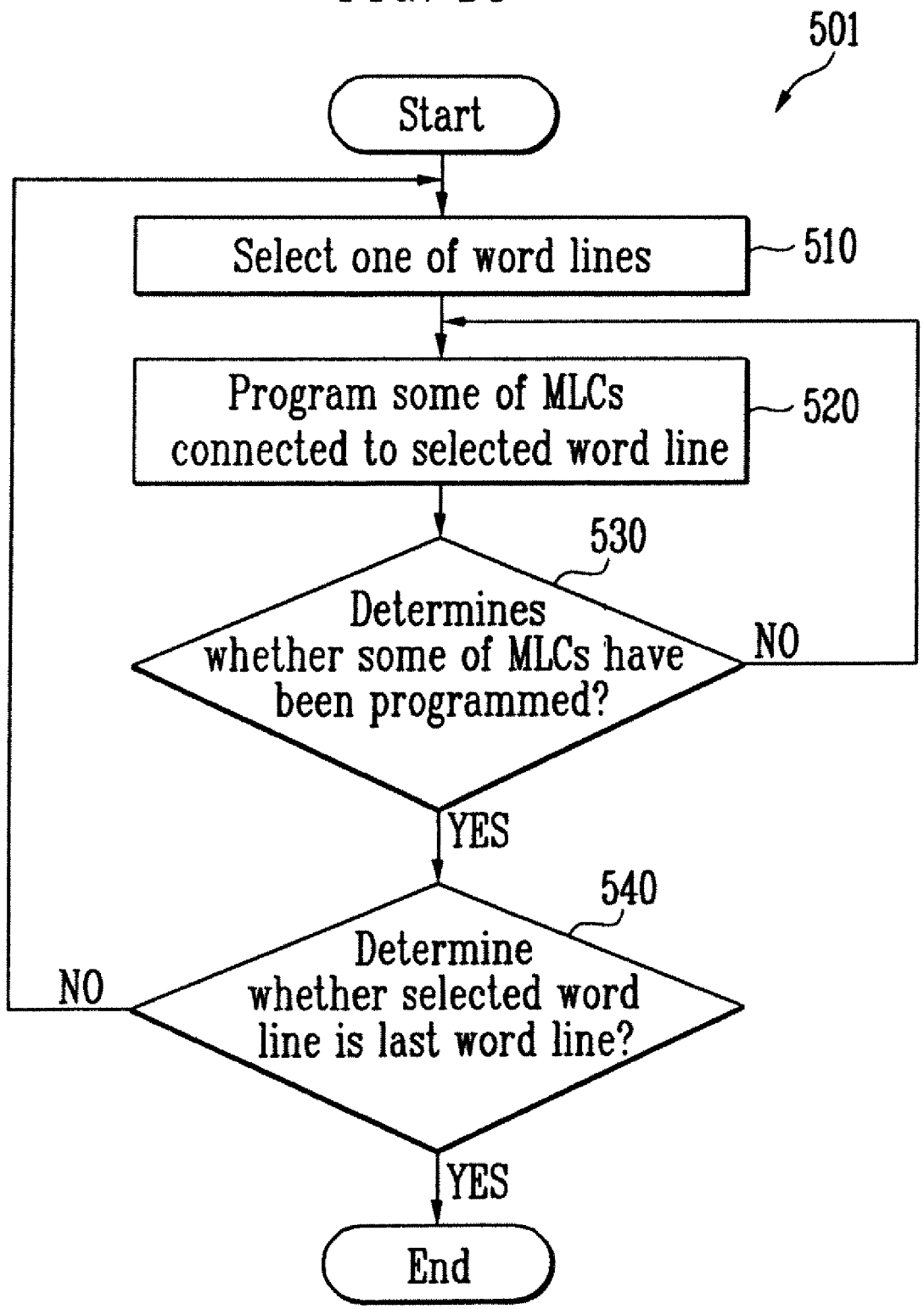
FIG. 13 is a detailed flowchart illustrating the process (501) shown in FIG. 12.

FIG. 13 is a detailed flowchart illustrating the process (501) shown in FIG. 12.

Referring to FIG. 13, one of (e.g., WL1) of the word lines WL1 to WLJ is selected (510). Thereafter, the program voltage is applied to the selected word line WL1. The page buffers PB1 to PBK input data for program to some of the bit lines BLe1 to BLeK, BLo1 to BLoK and inputs data for program prohibition to the remaining bit lines. As a result, some of the MLCs Me11 to Me1K or Mo11 to Mo1K connected to the selected word line WL1 are programmed (520).

It is determined whether some of the MLCs have been programmed (530). Thereafter, the steps (520, 530) are repeatedly performed until some of the MLCs Me11 to Me1K or Mo11 to Mo1K are programmed.

It is then determined whether the selected word line is the last word line (540). The steps (510 to 540) are repeatedly performed until the selected word line is the last word line. The process (501) is the same as the step (401), which has been described with reference to FIG. 5. The steps (510 to 540) will not be described for simplicity.

Figure 14:
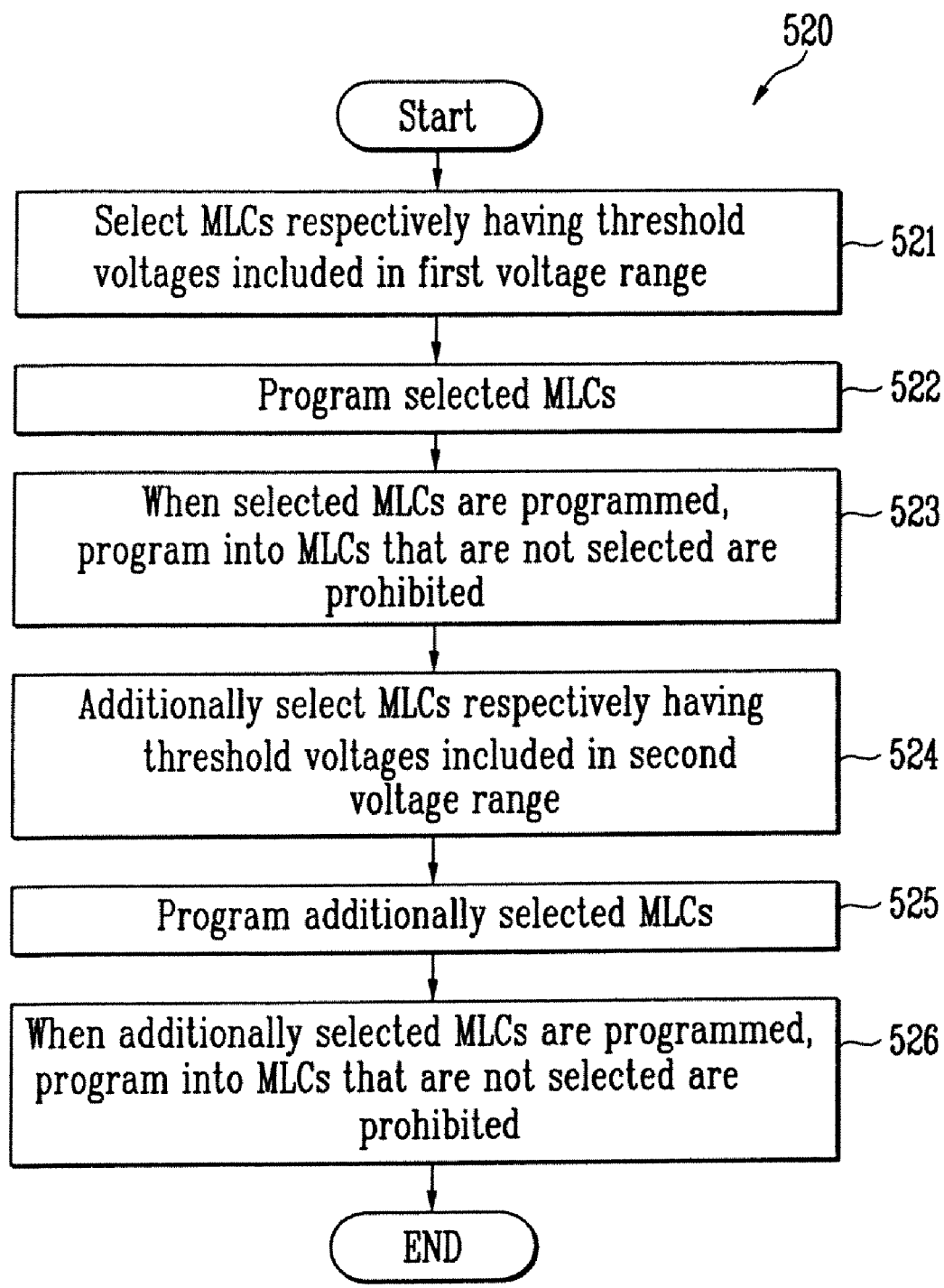
FIG. 14 is a detailed flowchart illustrating the process (520) shown in FIG. 13.

FIG. 14 is a detailed flowchart illustrating the process (520) shown in FIG. 13.

Figure 16A:
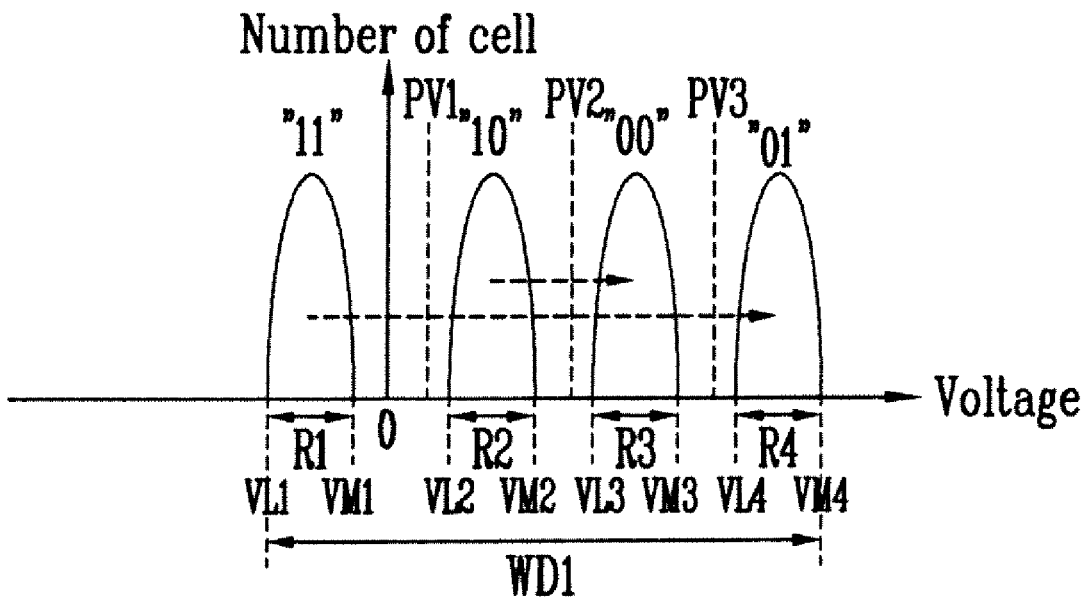
FIG. 16 is a graph showing threshold voltage distribution of MLCs, which are varied depending on the erase method according to another embodiment of the present invention.

MLCs (e.g., Me11 to Me16 or Mo11 to Mo16), each having threshold voltages included in a first voltage range (refer to R1 in FIG. 16(a)), are selected from MLCs Me11 to Me1K or Mo11 to Mo1K connected to a selected word line (e.g., WL1) (521).

Thereafter, the selected MLCs Me11 to Me16 or Mo11 to Mo16 are programmed so that the threshold voltages of the selected MLCs Me11 to Me16 or Mo11 to Mo16 are moved from the first voltage range (R1) to a fourth voltage range (refer to R4 in FIG. 16(a)) (522). When the selected MLCs Me11 to Me16 or Mo11 to Mo16 are programmed, program into non-selected MLCs Me17 to Me1K or Mo17 to Mo1K is prohibited (523).

The steps (521 to 523) are substantially the same as the steps (421a to 423a), which have been described with reference to FIG. 6. Detailed description thereof will be omitted.

Thereafter, MLCs (e.g., Me17 to Me112 or Mo17 to Mo112), each having threshold voltages included in a second voltage range (R2), are additionally selected from the MLCs Me11 to Me1K or Mo11 to Mo1K (524). The additionally selected MLCs Me17 to Me112 or Mo17 to Mo112 are programmed so that the threshold voltages of the additionally selected MLCs Me17 to Me112 or Mo17 to Mo112 are moved from the second voltage range (R2) to a third voltage range (refer to R3 in FIG. 16(a)) (525).

When the additionally selected MLCs Me17 to Me112 or Mo17 to Mo112 are programmed, program into non-selected MLCs Me113 to Me1K or Mo113 to Mo1K is prohibited (526). The steps (524 to 526) are substantially the same as the steps (424b to 426b), which have been described with reference to FIG. 8. Description thereof will be omitted.

Figure 16B:
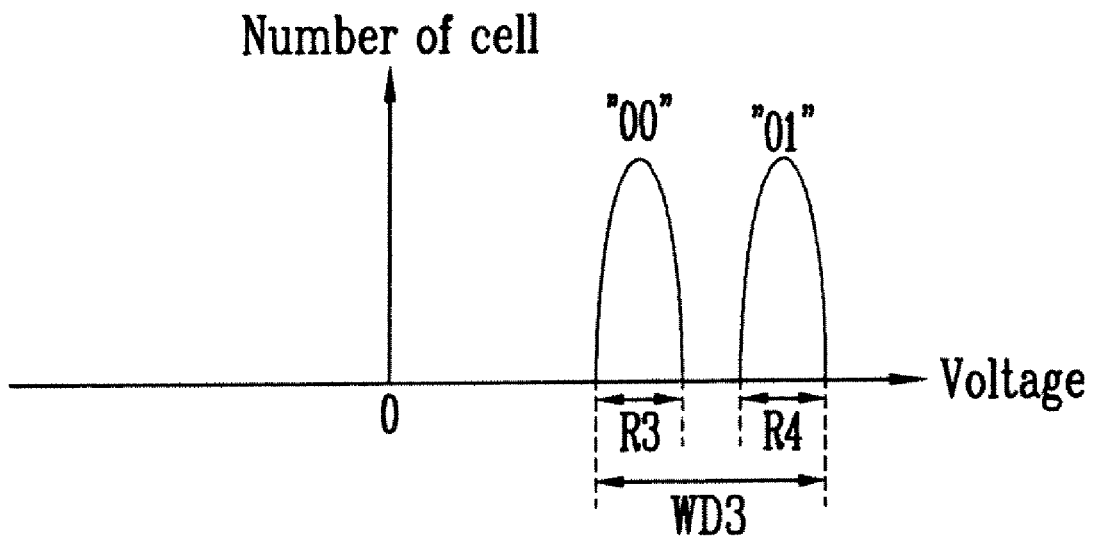
Figure 16C:
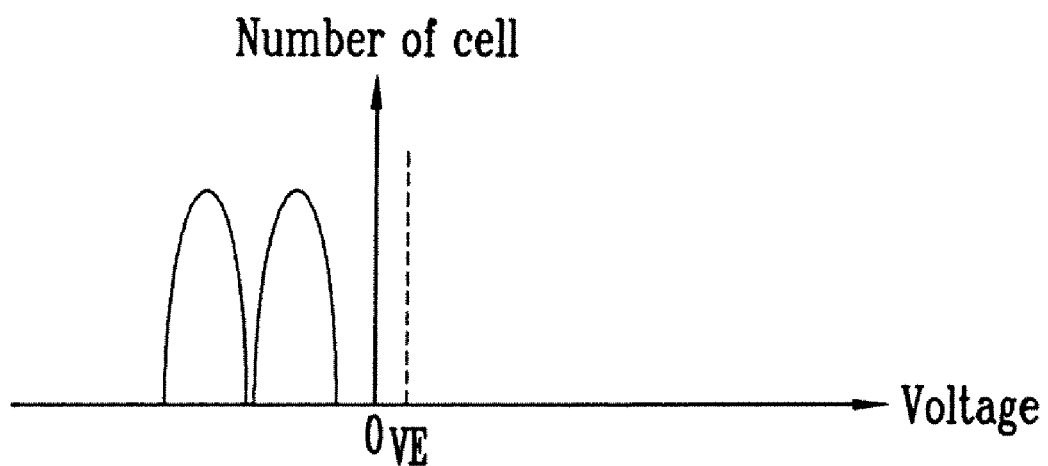

As described above, the threshold voltages of the MLCs Me11 to Me1K or Mo11 to Mo1K are included in the third and fourth voltage ranges (R3, R4), respectively, by means of the step (520), as shown in FIG. 16(b). As a result, the entire distribution range (WD3) (refer to FIG. 16(b)) of the threshold voltages of the MLCs Me11 to Me1K or Mo11 to Mo1K after the MLCs are pre-programmed can become narrower than the entire distribution range (WD11) (refer to FIG. 16(a)) of the threshold voltages of the MLCs Me11 to Me1K or Mo11 to Mo1K before the MLCs are pre-programmed.

Figure 15:
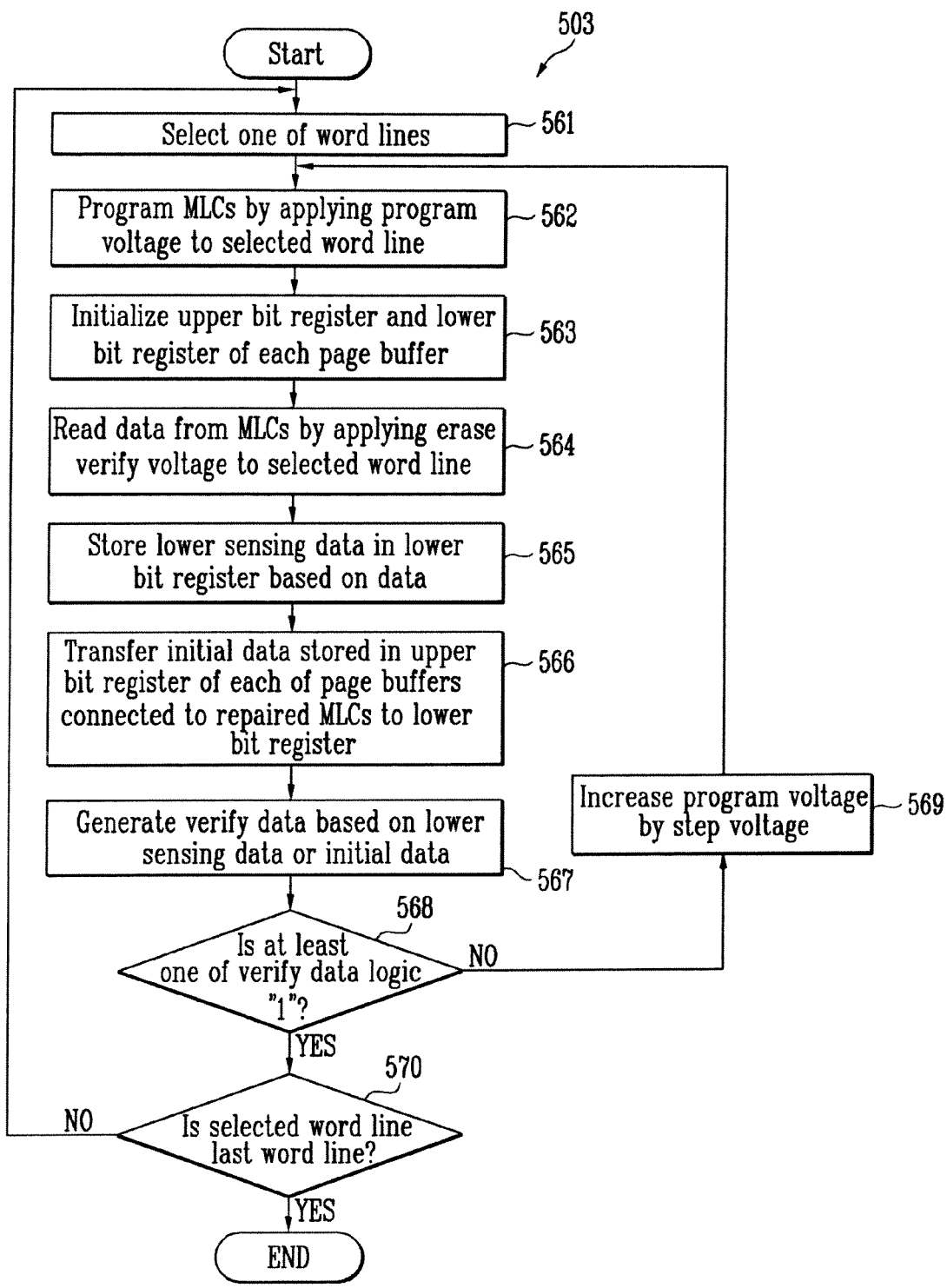
FIG. 15 is a detailed flowchart illustrating the process (503) shown in FIG. 12.

FIG. 15 is a detailed flowchart illustrating the process (503) shown in FIG. 12.

Referring to FIG. 15, one (e.g., WL1) of the word lines WL1 to WLJ is selected (561). As a program voltage (not shown) is applied to the selected word line WL1, MLCs Me11 to Me1K or Mo11 to Mo1K connected to the selected word line WL1 are programmed (562).

Thereafter, the upper bit register 220 and the lower bit register 230 of each of the page buffers PB1 to PBK are initialized in response to the read control signal (MREAD) and the read control signal (LREAD2) (563). As a result, the latch circuit 222 outputs the upper sensing data (SA) of logic "1" to the node Q2 and the latch circuit 232 outputs the lower sensing data (SL2) of logic "1" to the node Q4.

Figure 16D:
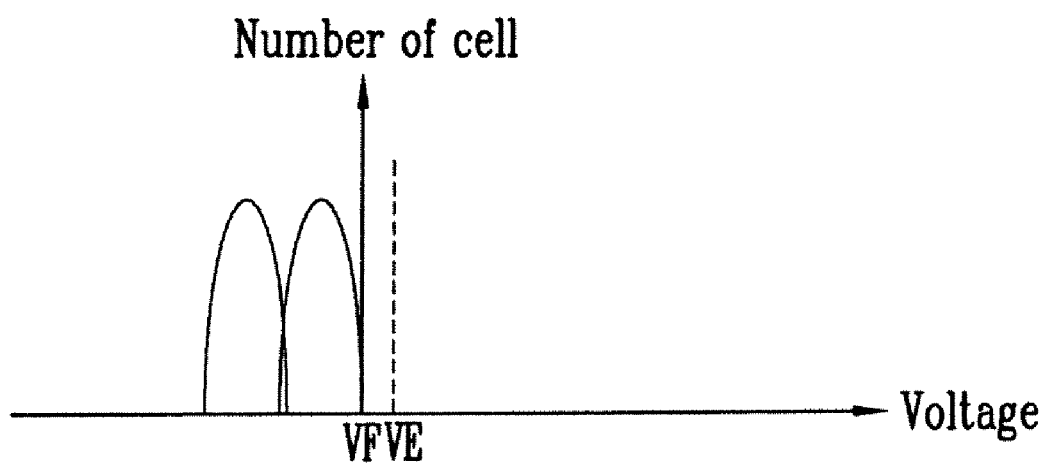

Thereafter, as an erase verify voltage (refer to VF in FIG. 16(d)) (e.g., 0V), which is lower than the erase verify voltage (VE), is applied to the selected word line WL1, data (not shown) are read from the MLCs Me11 to Me1K or Mo11 to Mo1K connected to the selected word line WL1 (564).

The lower bit register 230 of each of the page buffers PB1 to PBK senses a voltage of the sensing node SO, which is decided by each of the read data, in response to the read control signal (LREAD1), and stores the lower sensing data (SL1) depending on the sensing result (565).

For example, when the read data are logic "1" (i.e., a threshold voltage of a corresponding MLC is higher than the erase verify voltage (VF)), the lower bit register 230 can store the lower sensing data (SL1) of logic "0". On the other hand, when the read data are logic "0" (i.e., a threshold voltage of a corresponding MLC is lower than the erase verify voltage (VF)), the lower bit register 230 can maintain the storage state of the inverted lower sensing data (SL2) of logic "1" (i.e., an initialization state).

The data pass circuit 270 of each of the page buffers PB1, PB2 connected to repaired MLCs (i.e., fail cells) (e.g., Me11 to Me12 or Mo11 to Mo12), of the MLCs Me11 to Me1K or Mo11 to Mo1K connected to the selected word line WL1, transfers the initial data (SA) stored in the upper bit register 220 to the lower bit register 230 in response to the transmission control signal (MPGM) (566).

The lower bit register 230 senses a voltage of the sensing node SO, which is decided according to the initial data (SA), in response to the read control signal (LREAD2). The second verify circuit 260 of each of the page buffers PB1 to PBK generates the verify data (LVD1) in response to the inverted lower sensing data (SL2), which is generated on the basis of the lower sensing data (SL1) or the initial data (SA) stored in the lower bit register 230 (567).

For example, the second verify circuit 260 can generate verify data (one of LVD1 to LVDK) of logic "1" in response to the lower sensing data (SL1) and the second verify circuit 260 can generate verify data (one of LVD1 to LVDK) of logic "0" in response to the inverted lower sensing data (SL2).

A data compare circuit (not shown) determines whether at least one of the verify data (LVD1 to LVDK) output from the page buffers PB1 to PBK is logic "1" (568).

If it is determined that the verify data (LVD1 to LVDK) are all logic "0", the program voltage applied to the word line WL1 is increased by a step voltage (not shown) (569) and the steps (562 to 569) are repeatedly performed. Meanwhile, if it is determined that at least one of the verify data (LVD1 to LVDK) is logic "1", it is determined whether the selected word line is a last word line (570).

The steps (561 to 570) are repeatedly executed until the selected word line becomes the last word line. If it is determined that at least one of the verify data (LVD1 to LVDK) is logic "1" in the step (568), it is determined that the post program of the MLCs Me11 to Me1K or Mo11 to Mo1K has been completed.

The program method according to the present invention will be described in detail with reference to FIGS. 17 to 31.

Figure 17:
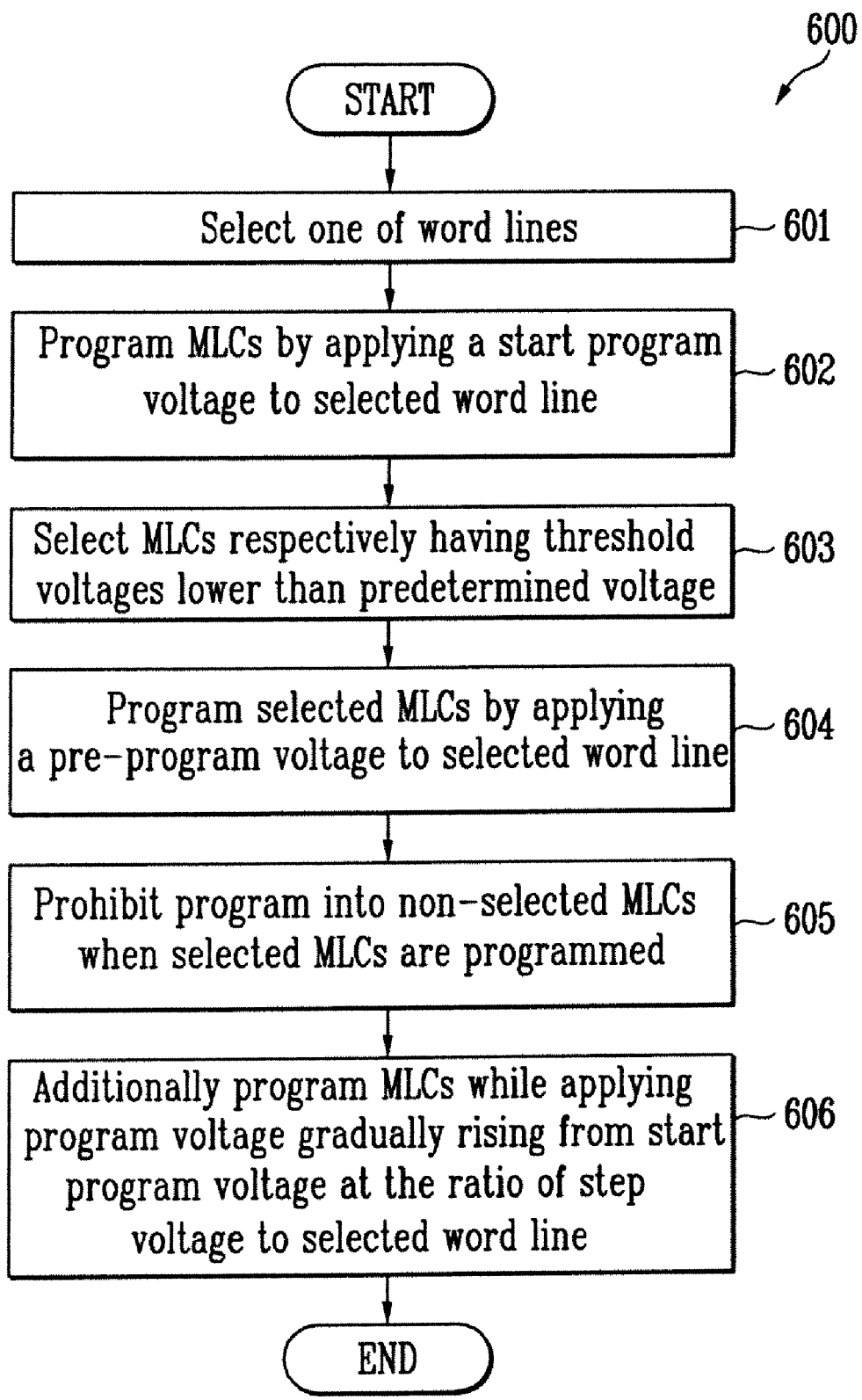
FIG. 17 is a flowchart illustrating a program method according to a first embodiment of the present invention.
Figure 18:
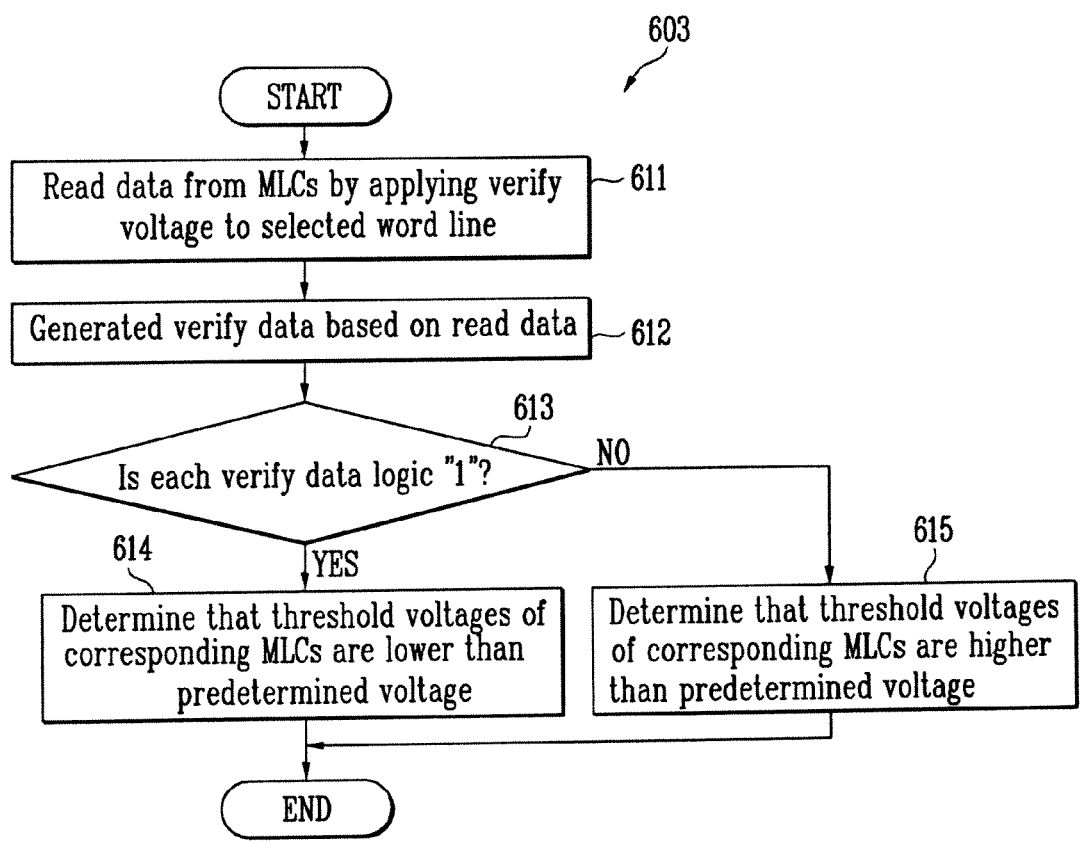
FIG. 18 is a detailed flowchart illustrating the process (603) shown in FIG. 17.

FIG. 17 is a flowchart illustrating a program method according to a first embodiment of the present invention. The program method is related to program of MLCs.

One (e.g., WL1) of the word lines WL1 to WLJ is selected (601). As a start program voltage (refer to VPA in FIG. 23) is applied to the selected word line WL1, the MLCs Me11 to Me1K or Mo11 to Mo1K connected to the selected word line WL1 are programmed (602). Thereafter, MLCs (e.g., Me11 to Me15 or Mo11 to Mo15), each having threshold voltages lower than a predetermined voltage, of the MLCs Me11 to Me1K or Mo11 to Mo1K, is selected (603). The step (603) will be described in more detail below with reference to FIG. 18.

The lower bit register 230 of each of the page buffers PB1 to PBK senses a voltage (e.g., VCC) of the sensing node SO in response to the read control signal (LREAD1) and stores the lower sensing data (SL1) of logic "0" depending on the sensing result, so that it is initialized.

Thereafter, as a verify voltage (refer to PV0 or PVN in FIG. 23) is applied to the selected word line WL1, data (not shown) are read from the MLCs Me11 to Me1K or Mo11 to Mo1K (611). At this time, the verify voltage (PV0) can be set to be lower than a verify voltage (refer to PV1 in FIG. 26) and the verify voltage (PVN) can be set to a negative voltage. The predetermined voltage can be higher than or the same as the verify voltage (PV0 or PVN).

The page buffers PB1 to PBK generate the verify data (LVD1 to LVDK), respectively, based on the read data (612). This will be described in more detail.

The lower bit register 230 of the page buffers PB1 to PBK senses a voltage of the sensing node SO, which is decided according to the read data, in response to the read control signal (LREAD2) and stores the lower sensing data (SL2b) depending on the sensing result.

For example, when the read data are logic "1" (i.e., when a threshold voltage of a corresponding MLC is higher than the verify voltage (PV0 or PVN)), the lower bit register 230 stores the lower sensing data (SL2b) (i.e., the inverted lower sensing data (SL2) of logic "1") of logic "0". Meanwhile, when the read data are logic "0" (i.e., the threshold voltage of the MLC is lower than the verify voltage (PV0 or PVN)), the lower bit register 230 maintains the storage state of the lower sensing data (SL1) of logic "0" (i.e., an initialization state). The lower sensing data (SL1) of logic "0", which are stored in the lower bit register 230, are used as program data in a subsequent program step (604).

The second verify circuit 260 of each of the page buffers PB1 to PBK generates verify data (one of LVD1 to LVDK) in response to the lower sensing data (SL1) or the inverted lower sensing data (SL2) received from the lower bit register 230. For example, the second verify circuit 260 can generate verify data (one of LVD1 to LVDK) of logic "1" in response to the lower sensing data (SL1), and the second verify circuit 260 can generate verify data (one of LVD1 to LVDK) of logic "0" in response to the inverted lower sensing data (SL2).

Thereafter, the data compare circuit (not shown) determines whether each of the verify data (LVD1 to LVDK) is logic "1" (613). It is determined that MLCs (e.g., Me11 to Me15 or Mo11 to Mo15) corresponding to verify data (e.g., LVD1 to LVD5) of logic "1" have threshold voltages lower than a predetermined voltage (614).

Furthermore, it is determined that MLCs (e.g., Me16 to Me1K or Mo16 to Mo1K) corresponding to verify data (e.g., LVD6 to LVDK), which are not logic "1", have threshold voltages higher than a predetermined voltage (615).

As a result, the MLCs Me11 to Me15 or Mo11 to Mo15, each having threshold voltages lower than the predetermined voltage, of the MLCs Me11 to Me1K or Mo11 to Mo1K, can be filtered.

Referring back to FIG. 17, as a pre-program voltage (VPE) higher than the start program voltage (VPA) is applied to the selected word line WL1, the selected MLCs Me11 to Me15 or Mo11 to Mo15 are programmed (604). The pre-program voltage (VPE) can be set to be higher than the start program voltage (VPA) and can be set to be lower than or the same as the highest program voltage (refer to VPT in FIG. 23).

At step (604), the page buffers PB1 to PB6 output the lower sensing data (SL1) of logic "0", which are stored in the lower bit register 230 in the step (612), to the bit lines BLe11 to BLe15 or BLo11 to BLo15, respectively, as program data through the sensing node SO in response to the transmission control signal (SPGM).

Meanwhile, when the selected MLCs Me11 to Me15 or Mo11 to Mo15 are programmed, program into non-selected MLCs Me16 to Me1K or Mo16 to Mo1K is prohibited (605). In more detail, the page buffers PB6 to PBK output the inverted lower sensing data (SL2) of logic "1", which are stored in the lower bit register 230 in the step (612), to the bit lines BLe17 to BLe1K or BLo17 to BLo1K, respectively, as program prohibit data through the sensing node SO in response to the transmission control signal (SPGM).

Thereafter, as program voltages (VP1 to VPT), which gradually rise from the start program voltage (VPA) at the ratio of the step voltage (VS), are sequentially applied to the selected word line WL1, the MLCs Me11 to Me1K or Mo11 to Mo1K are additionally programmed (606).

Figure 19:
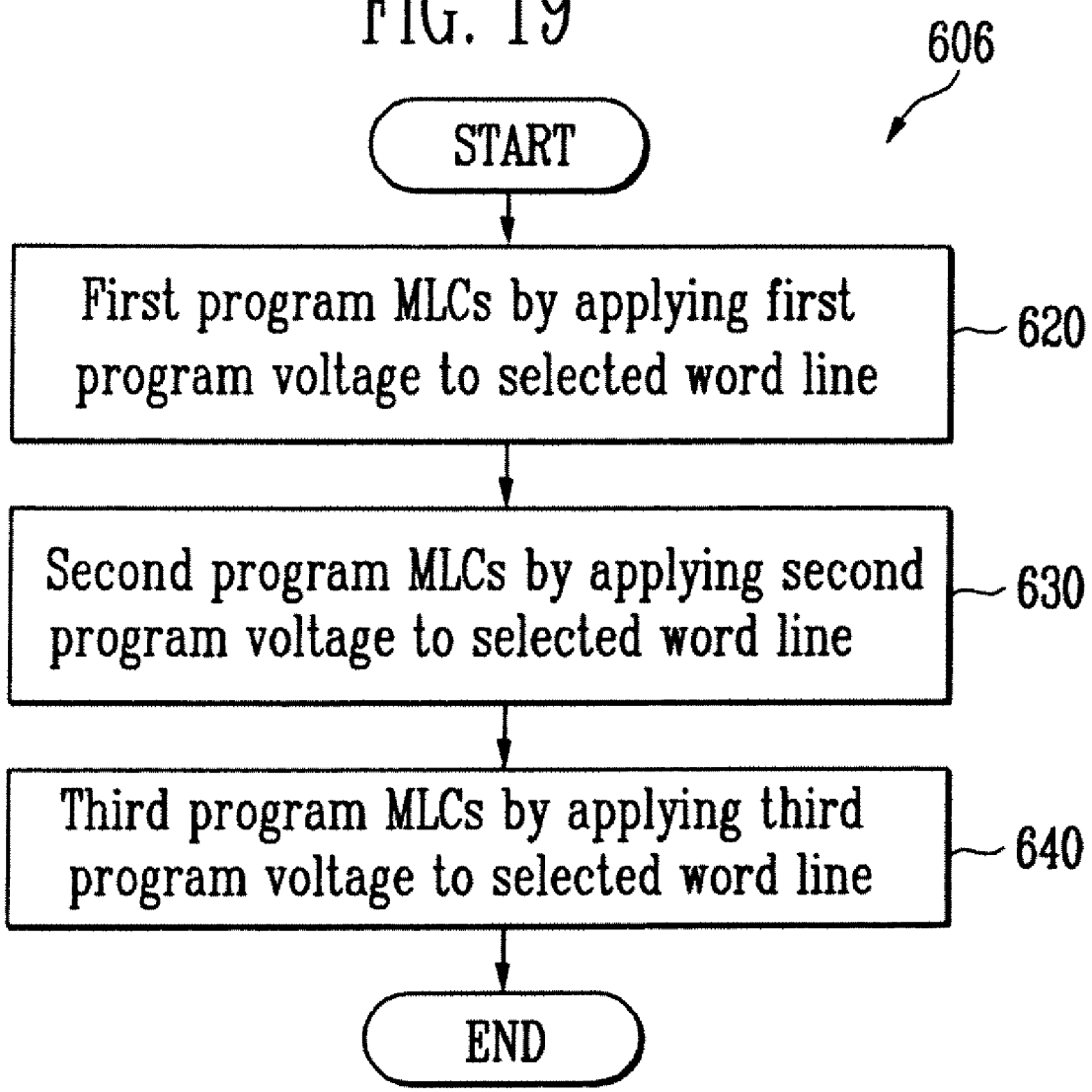
FIG. 19 is a detailed flowchart illustrating the process (606) shown in FIG. 19.

FIG. 19 is a detailed flowchart illustrating the process (606) shown in FIG. 19.

Referring to FIG. 19, as first program voltages (VP1 to VPR) (R is an integer), which gradually rise from the start program voltage (VPA) at the ratio of the step voltage (VS), are sequentially applied to the selected word line WL1, the MLCs Me11 to Me1K or Mo11 to Mo1K are first programmed (620).

Furthermore, as second program voltages (VP(R+1) to VPS) (S is an integer) that gradually rise from the first program voltage (VPR), which has finally risen in the step (620) at the ratio of the step voltage (VS), are applied to the word line WL1, the MLCs Me11 to Me1K or Mo11 to Mo1K are second programmed (630).

Furthermore, as third program voltages (VP(S+1) to VPT) (T is an integer) that gradually rise from the first program voltage (VPR), which has finally risen in the step (630) at the ratio of the step voltage (VS), are applied to the word line WL1, the MMLCs Me11 to Me1K or Mo11 to Mo1K are third programmed (640).

Figure 20:
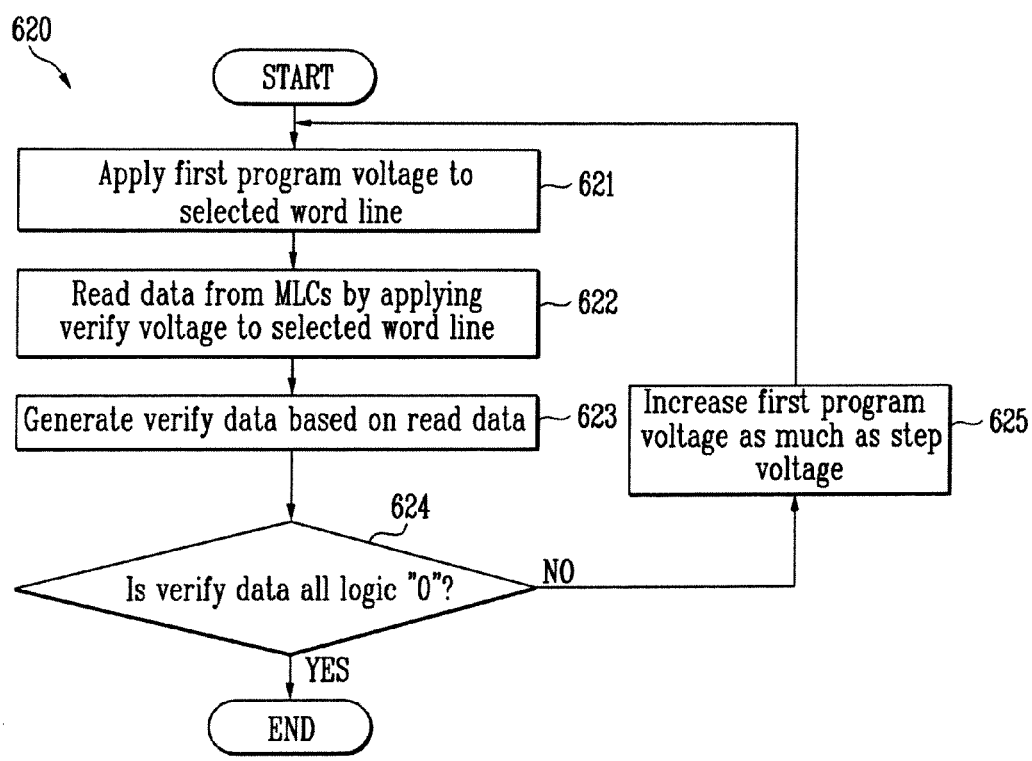
FIG. 20 is a detailed flowchart illustrating the process (620) shown in FIG. 19.

FIG. 20 is a detailed flowchart illustrating the process (620) shown in FIG. 19.

Referring to FIG. 20, the first program voltage (VP1) is applied to the selected word line WL1 (621). Though not shown in FIG. 20, the lower bit register 230 of each of the page buffers PB1 to PBK is in an initialization state (i.e., a state where the lower sensing data (SL1) of logic "0" are stored) in response to the read control signal (LREAD1) prior to the step (621).

Furthermore, input data (D1b or D2) are stored in the upper bit register 220 of each of the page buffers PB1 to PBK. Thereafter, the data pass circuit 270 of each of the page buffers PB1 to PBK transfers the input data (D1b or D2) stored in the upper bit register 220 to the lower bit register 230 in response to the transmission control signal (MPGM).

The lower bit register 230 senses a voltage of the sensing node SO, which is decided according to the input data (D1b or D2), in response to the read control signal (LREAD2).

For example, when the input data (D1b or D2) are logic "1", the lower bit register 230 can store the lower sensing data (SL2b) of the logic "0", which are generated from the node Q3. To the contrary, when the input data (D1b or D2) are logic "0", the lower bit register 230 is kept to an initialization state (i.e., a state where the lower sensing data (SL1) of logic "0" are stored).

Therefore, when the first program voltage (VP1) is applied to the word line WL1, the data pass circuits 270 of the page buffers PB1 to PBK output the lower sensing data (SL1) of logic "0" (or the inverted lower sensing data (SL2b) of logic "1"), which are stored in the lower bit register 230, to the bit lines BLe11 to BLe1K or BLo11 to BLo1K, respectively, as program data through the sensing node SO n response to the transmission control signal (SPGM). As a result, the MLCs Me11 to Me1K or Mo11 to Mo1K are programmed.

Thereafter, as a verify voltage (refer to PV1, FIGS. 26 and 23) is applied to the word line WL1, data (not shown) are read from the MLCs Me11 to Me1K or Mo11 to Mo1K (622).

The page buffers PB1 to PBK generate the verify data (LVD1 to LVDK) based on the read data (623). The operation of the page buffers PB1 to PBK in the step (623) is substantially the same as that of the page buffers PB1 to PBK in the step (612), which has been described earlier. Description thereof will be omitted.

The data compare circuit determines whether the verify data (LVD1 to LVDK) are all logic "0" (624). If the verify data (LVD1 to LVDK) are not all logic "0" in the step (624), the first program voltage (VP1) is increased as much as the step voltage (VS) (625).

Thereafter, the first program voltage (VP2) increased in the step (625) is applied to the word line WL1. The steps (621 to 625) are repeatedly executed. Furthermore, if the verify data (LVD1 to LVDK) are all logic "0" in the step (624), the first program process (620) is finished and the second program process (630) begins.

Figure 21:
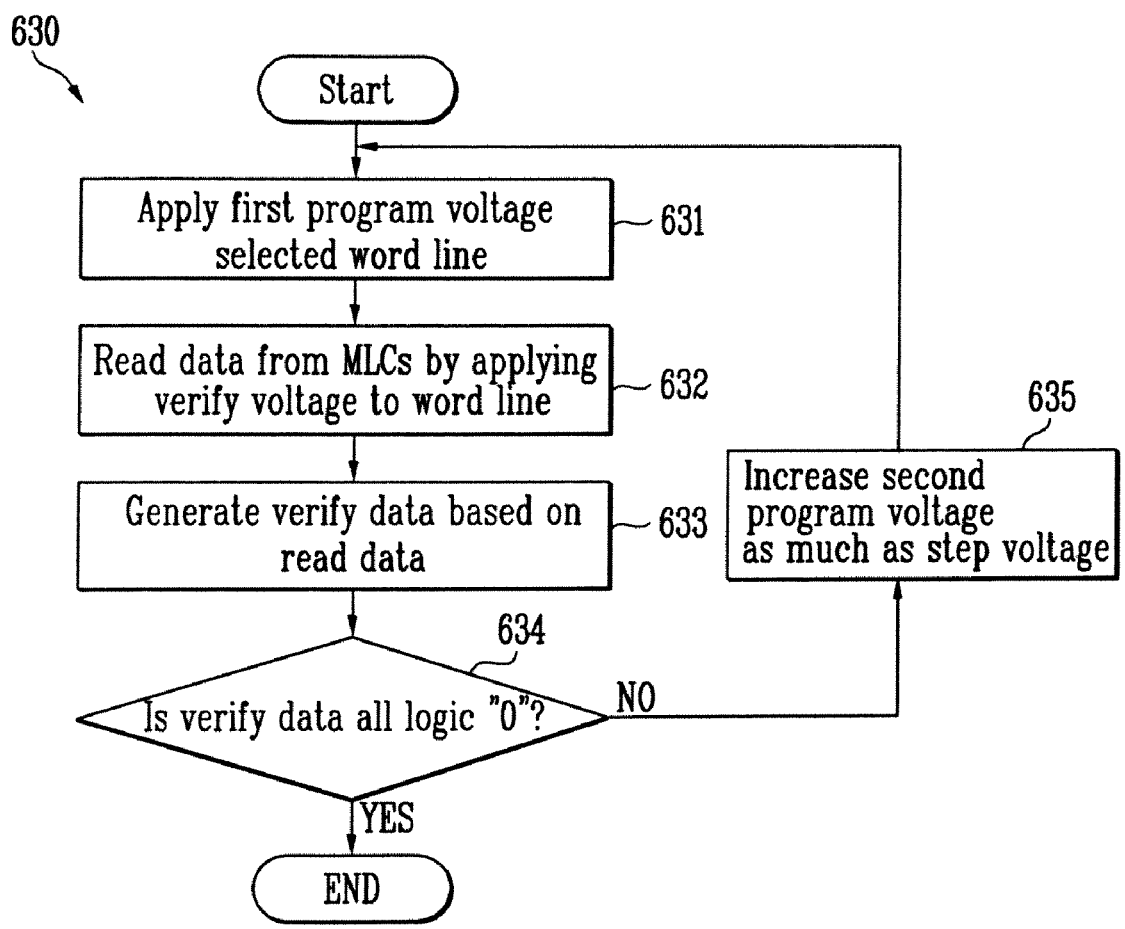
FIG. 21 is a detailed flowchart illustrating the process (630) shown in FIG. 19.

FIG. 21 is a detailed flowchart illustrating the process (630) shown in FIG. 19.

A second program voltage (VP(R+1)), which is the step voltage (VS) higher than the first program voltage (VPR) that has rises finally in the step (620), is applied to the selected word line WL1 (631).

Though not shown in FIG. 21, the lower bit register 230 of each of the page buffers PB1 to PBK is in an initialization state (i.e., a state where the lower sensing data (SL1) of logic "0" are stored) in response to the read control signal (LREAD1) prior to the step (631).

Furthermore, input data (D1b or D2) are stored in the upper bit register 220 of each of the page buffers PB1 to PBK. Thereafter, the data pass circuit 270 of each of the page buffers PB1 to PBK transfers the input data (D1b or D2) stored in the upper bit register 220 to the bit lines BLe11 to BLe1K or BLo11 to BLo1K, respectively, as program data through the sensing node SO in response to the transmission control signal (MPGM).

Thereafter, as a verify voltage (refer to PV2 in FIGS. 26 and 23), which is higher than the verify voltage (PV1), is applied to the word line WL1, data (not shown) are read from the MLCs Me11 to Me1K or Mo11 to Mo1K (632).

The page buffers PB1 to PBK generates the verify data (MVD1 to MVDK), respectively, based on the read data (633). This will be described in more detail.

The upper bit register 220 of each of the page buffers PB1 to PBK senses a voltage of the sensing node SO, which is decided according to each of the read data, in response to the read control signal (MREAD), and stores the upper sensing data (SAb) depending on the sensing result.

For example, when the read data are logic "1" (i.e., when a threshold voltage of a corresponding MLC is higher than the verify voltage (PV2)), the upper bit register 220 stores the upper sensing data (SAb) of logic "0" (i.e., the inverted upper sensing data (SA) of logic "1"). On the other hand, when the read data are logic "0" (i.e., when a threshold voltage of a corresponding MLC is lower than the verify voltage (PV2)), the upper bit register 220 maintains the storage state of the input data (D1b or D2).

The first verify circuit 250 of the page buffers PB1 to PBK generates verify data (one of MVD1 to MVDK) in response to the upper sensing data (SA) or the input data (D1b or D2) received from the upper bit register 220.

For example, the first verify circuit 250 can generate verify data (one of MVD1 to MVDK) of logic "0" in response to the upper sensing data (SA), and can generate verify data (one of MVD1 to MVDK) of logic "1" in response to the input data (D1b or D2).

A data compare circuit (not shown) determines whether the verify data (MVD1 to MVDK) are all logic "0" (634). If the verify data (MVD1 to MVDK) are not all logic "0" in the step (634), the second program voltage (VP(R+1)) is increased by the step voltage (VS) (635).

Thereafter, the second program voltage (VP(R+2)) that has risen in the step (635) is supplied to the word line WL1 and the steps (631 to 635) are repeatedly executed.

Meanwhile, if the verify data (MVD1 to MVDK) are all logic "0" in the step (634), the second program process (630) is finished and the third program process (640) begins.

Figure 22:
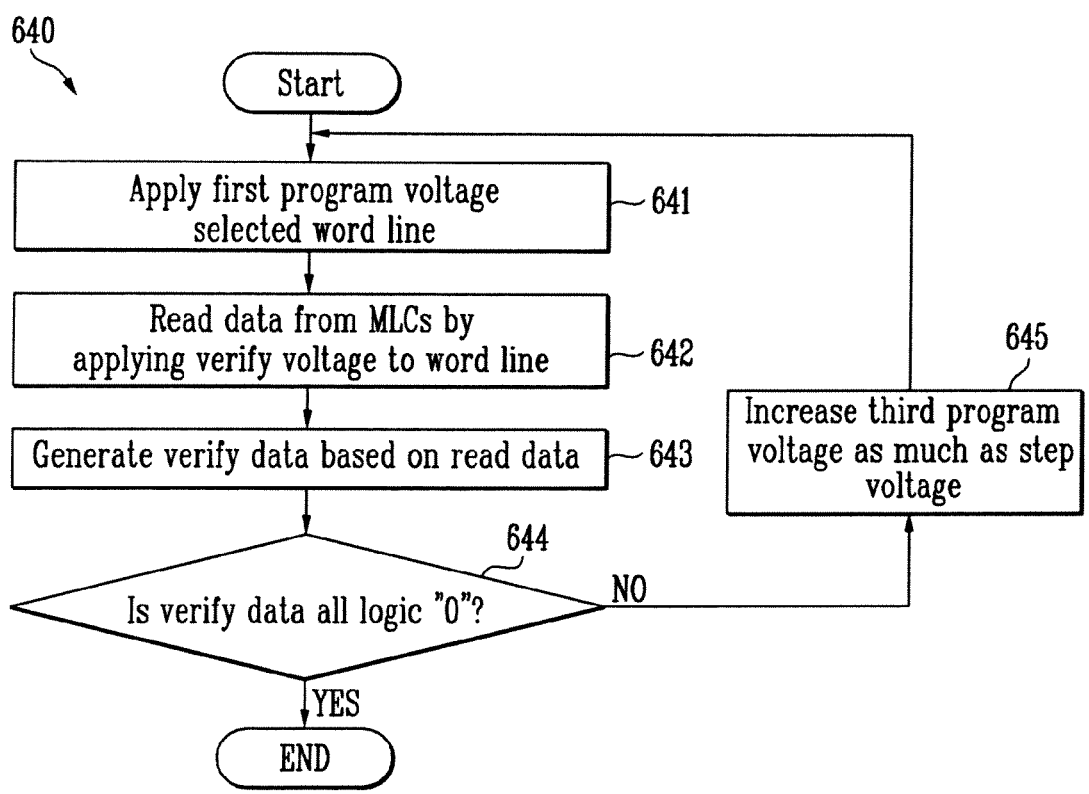
FIG. 22 is a detailed flowchart illustrating the process (640) shown in FIG. 19.
Figure 23:
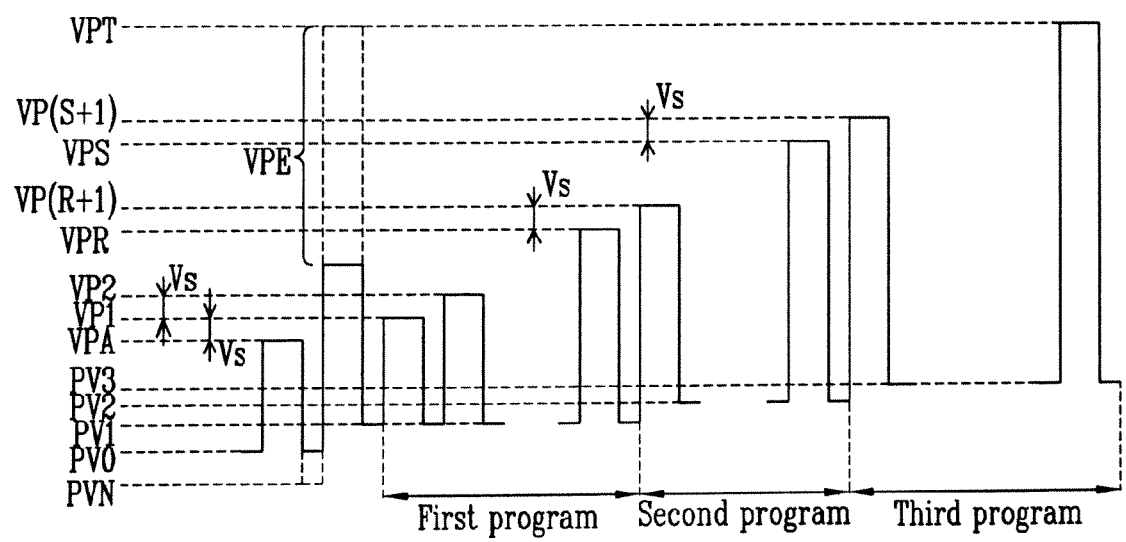
FIG. 23 is a view showing variation in a voltage applied to a word line in a program method according to a first embodiment of the present invention.

FIG. 22 is a detailed flowchart illustrating the process (640) shown in FIG. 19.

A third program voltage (VP(S+1)), which is the step voltage (VS) higher than the second program voltage (VPS) that has risen in the step (630), is applied to the selected word line WL1 (641). Though not shown in FIG. 22, the lower bit register 230 of each of the page buffers PB1 to PBK is initialized in response to the read control signal (LREAD1) prior to the step (641).

Furthermore, the input data (D1b or D2) are stored in the upper bit register 220 of each of the page buffers PB1 to PBK. Thereafter, when the same read voltage as the verify voltage (PV1) is applied to the word line WL1, data (i.e., lower bit data) are read from the MLCs Me11 to Me1K or Mo11 to Mo1K. At this time, the lower bit register 230 senses the lower bit data in response to the read control signal (LREAD2) and stores the lower sensing data (SL2b) depending on the sensing result.

Furthermore, the data pass circuit 270 of each of the page buffers PB1 to PBK transfers the input data (D1b or D2), which are stored in the upper bit register 220, to the lower bit register 230 in response to the transmission control signal (MPGM). The lower bit register 230 senses a voltage of the sensing node SO, which is decided according to the input data (D1b or D2), in response to the read control signal (LREAD2) and stores the lower sensing data (SL2b) according to the sensing result.

Thereafter, the data pass circuits 270 of the page buffers PB1 to PBK output the input data (D1b or D2) stored in the upper bit register 220 to the bit lines BLe11 to BLe1K or BLo11 to BLo1K, respectively, as program data through the sensing node SO. As a result, the MLCs Me11 to Me1K or Mo11 to Mo1K are programmed.

As a verify voltage (PV3 in FIGS. 26 and 23) higher than the verify voltage (PV2) is applied to the word line WL1, data (not shown) are read from the MLCs Me11 to Me1K or Mo11 to Mo1K (642).

The page buffers PB1 to PBK generate the verify data (LVD1 to LVDK), respectively, based on the read data (643). This will be described in more detail. The lower bit register 220 of the page buffers PB1 to PBK senses a voltage of the sensing node SO, which is decided according to each of the read data, in response to the read control signal (LREAD2), and stores the lower sensing data (SL2b) depending on the sensing result.

For example, when the read data are logic "1" (i.e., a threshold voltage of a corresponding MLC is higher than the verify voltage (PV3)), the lower bit register 230 can store the lower sensing data (SL2b) of the logic "0". To the contrary, when the read data are logic "0" (i.e., a threshold voltage of a corresponding MLC is lower than the verify voltage (PV3)), the lower bit register 230 maintains the stores lower sensing data (SL1 or SL2) based on the input data (D1b or D2) or the lower bit data prior to the step (641).

The second verify circuit 260 of each of the page buffers PB1 to PBK generates verify data (one of LVD1 to LVDK) in response to the lower sensing data (SL1 or SL2) received from the lower bit register 230. For example, the second verify circuit 260 can generate verify data (one of LVD1 to LVDK) of logic "1" in response to the lower sensing data (SL1) and can generate verify data (one of LVD1 to LVDK) of logic "0" in response to the lower sensing data (SL2).

A data compare circuit determines whether the verify data (LVD1 to LVDK) are logic "0" (644). If the verify data (LVD1 to LVDK) are not all logic "0" in the step (644), the third program voltage (VP(S+1)) is increased as much as the step voltage (VS) (645).

Thereafter, the third program voltage (VP(S+2)) that has risen in the step (645) is applied to the word line WL1, and the steps (641 to 645) are repeatedly executed. Meanwhile, if the verify data (LVD1 to LVDK) are all logic "0" in the step (644), the third program process (640) is finished.

Figure 24:
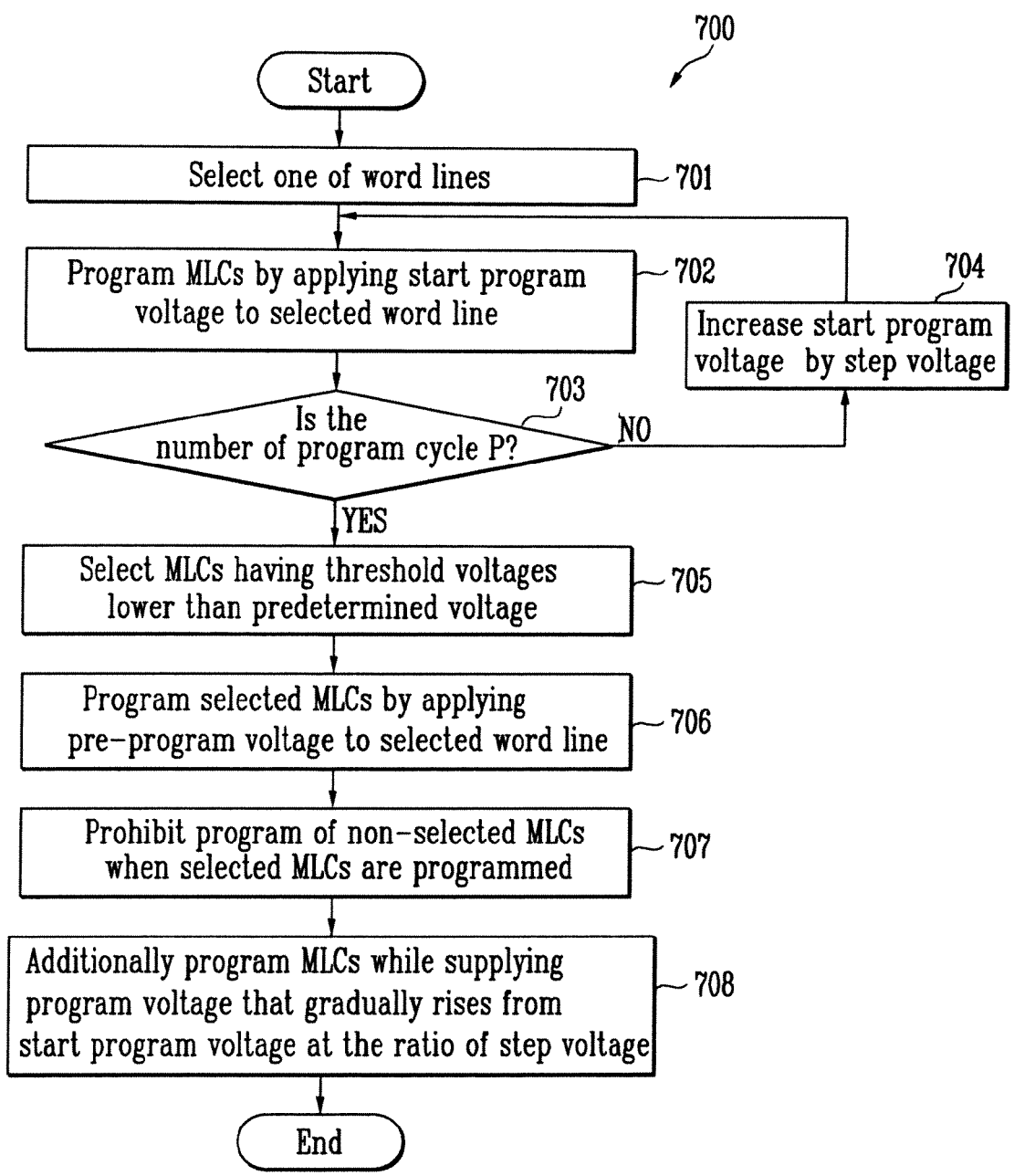
FIG. 24 is a flowchart illustrating a program method according to a second embodiment of the present invention.
Figure 25:
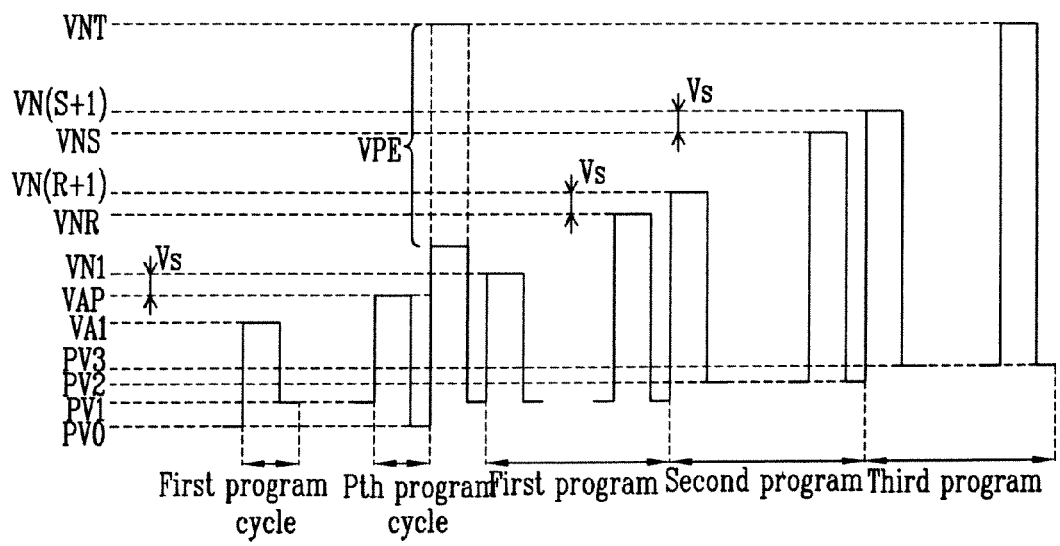
FIG. 25 is a view showing variation in a voltage applied to a word line in a program method according to a second embodiment of the present invention.
Figure 26:
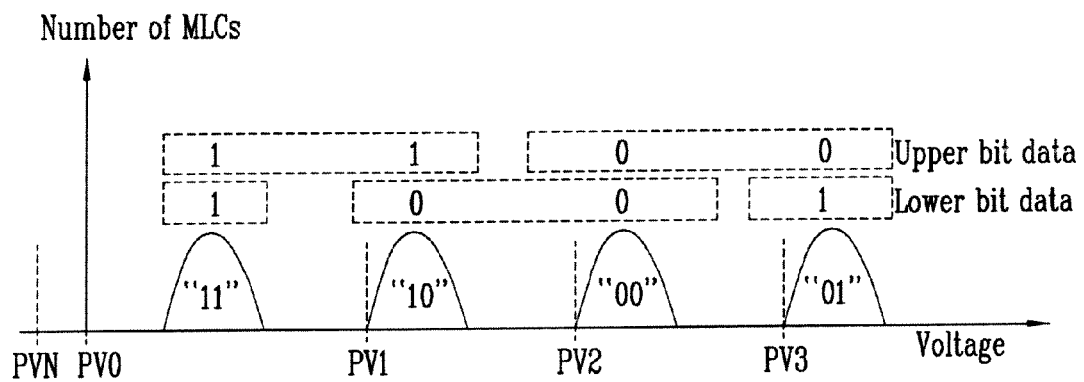
FIG. 26 is a view showing the relationship between the verify voltages and threshold voltage of MLCs shown in FIGS. 23 and 25.

FIG. 24 is a flowchart illustrating a program method according to a second embodiment of the present invention. This method is related to program of MLCs.

One (e.g., WL1) of the word lines WL1 to WLJ is selected (701). As a start program voltage (refer to VA1 in FIG. 25) is applied to the selected word line WL1, the MLCs Me11 to Me1K or Mo11 to Mo1K connected to the word line WL1 are programmed (702).

The operation of the page buffers PB1 to PBK in the step (702) is the same as that of the page buffers PB1 to PBK in the step (620), which have been described with reference to FIG. 20. Description thereof will be omitted.

Thereafter, it is determined whether the number of program cycles, which is being executed, is P (703). If the number of program cycles, which is being executed, is not P in the step (703), the start program voltage (VA1) is increased as much as the step voltage (VS) (704). As a result, the word line WL1 is supplied with a start program voltage (VA2) that has risen from the start program voltage (VA1) as much as the step voltage (VS).

Thereafter, the steps (701 to 704) are repeatedly executed until the number of the program cycle becomes P. When the number of the program cycle becomes P, MLCs (e.g., Me11 to Me15 or Mo11 to Mo15), each having threshold voltages lower than a predetermined voltage, of the MLCs Me11 to Me1K or Mo11 to Mo1K, are selected (705).

As the selected word line WL1 is supplied with the pre-program voltage (VPE), the selected MLCs Me11 to Me15 or Mo11 to Mo15 are programmed (706). The pre-program voltage (VPE) can be set to be higher than a start program voltage (refer to VAP in FIG. 25) and to be lower than or the same as the highest program voltage (refer to VNT in FIG. 25).

Meanwhile, when the selected MLCs Me11 to Me15 or Mo11 to Mo15 are programmed, program into non-selected MLCs Me16 to Me1K or Mo16 to Mo1K is prohibited (707).

Thereafter, as the program voltages (VN1 to VNT) that gradually rise from the start program voltage (VAP) at the ratio of the step voltage (VS) are sequentially applied to the selected word line WL1, the MLCs Me11 to Me1K or Mo11 to Mo1K are additionally programmed (708).

The steps (705 to 708) are the same as the steps (603 to 606), which have been described with reference to FIG. 17. Description thereof will be omitted.

As described above, in the program method according to the present invention, selected MLCs are pre-programmed by selecting only MLCs having threshold voltages lower than a predetermined voltage (i.e., MLCs having a slow program speed) and applying a pre-program voltage higher than a program voltage, which has been previously applied, to a word line. It is thus possible to shorten an overall program time.

Figure 27:
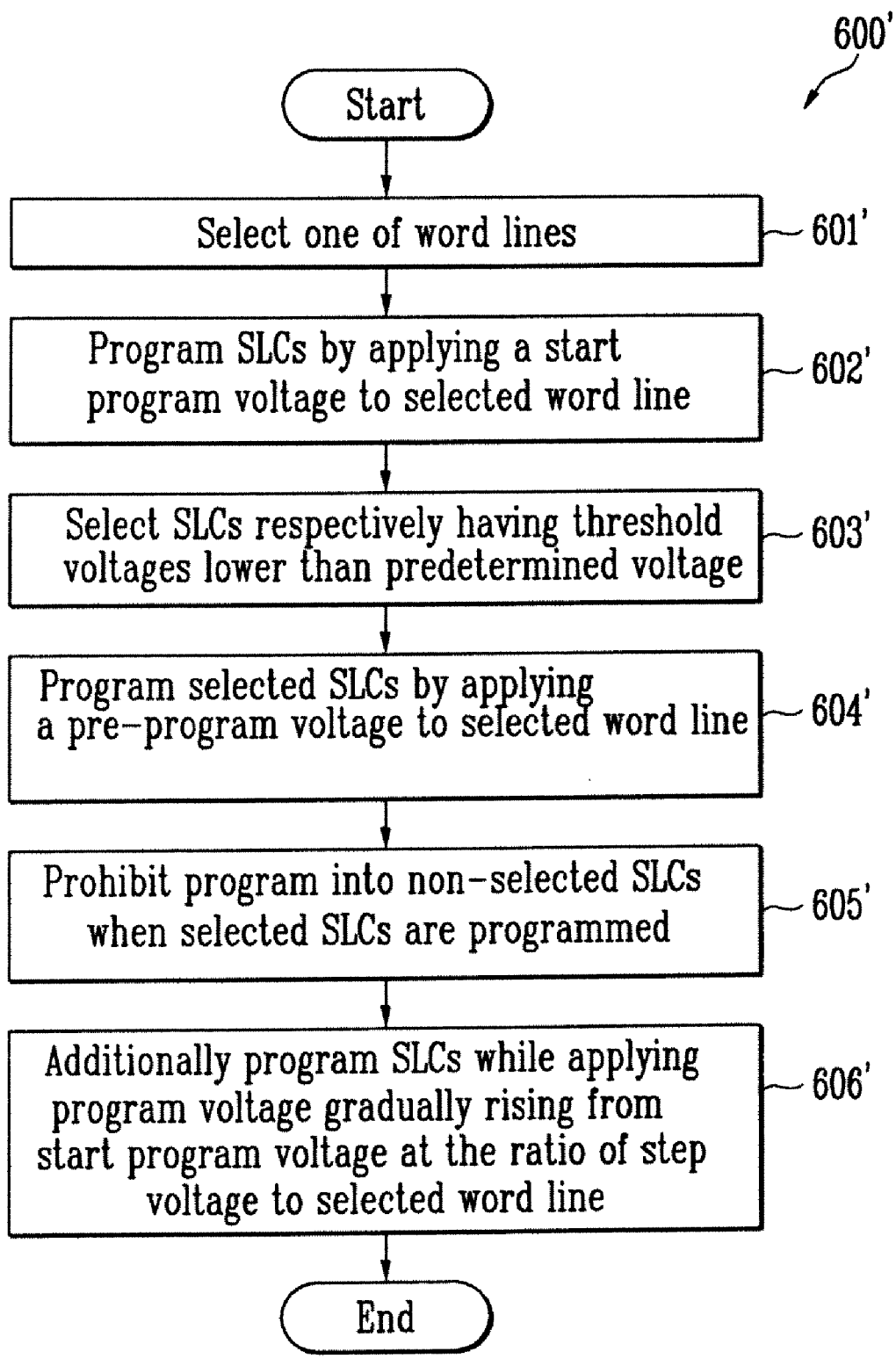
FIG. 27 is a flowchart illustrating a program method according to a third embodiment of the present invention.
Figure 28:
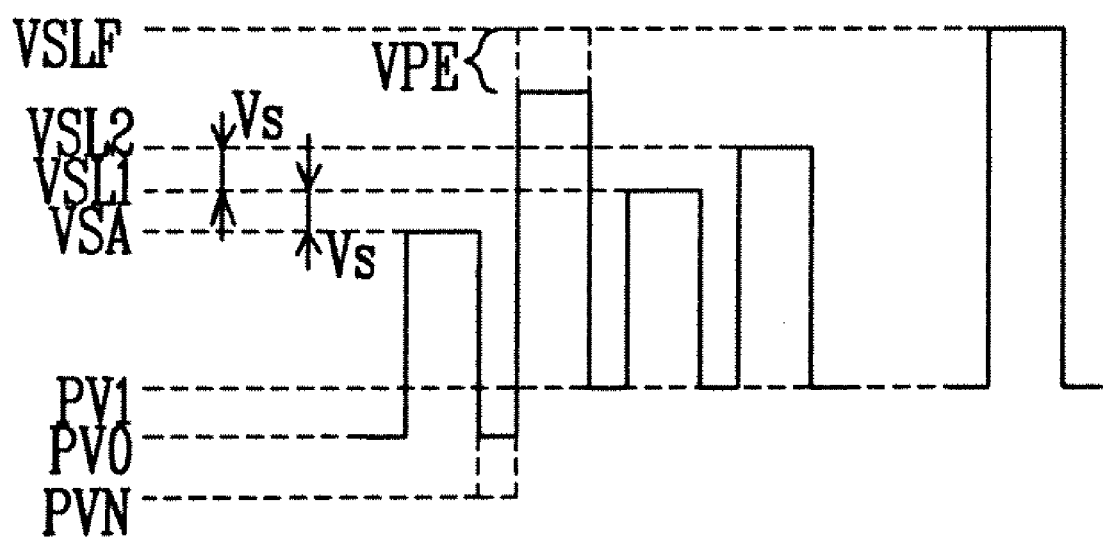
FIG. 28 is a view showing variation in a voltage applied to a word line in a program method according to a third embodiment of the present invention.

FIG. 27 is a flowchart illustrating a program method according to a third embodiment of the present invention. This method is related to program of SLCs.

One (e.g., WL1) of the word lines WL1 to WLJ is selected (601').

As the selected word line WL1 is supplied with a start program voltage (refer to VSA in FIG. 28), SLCs Me11 to Me1K or Mo11 to Mo1K connected to the selected word line WL1 are programmed (602').

Thereafter, SLCs (e.g., Me11 to Me15 or Mo11 to Mo15), each having threshold voltages lower than a predetermined voltage, of the SLCs Me11 to Me1K or Mo11 to Mo1K, are selected (603'). Though detailed steps of the step (603') has not been shown, the step (603') can be performed in the same manner as that described with reference to FIG. 18.

The lower bit register 230 of each of the page buffers PB1 to PBK senses a voltage (e.g., VCC) of the sensing node SO in response to the read control signal (LREAD1) and stores the lower sensing data (SL1) of logic "0" depending on the sensing result, so that it is initialized.

Thereafter, as the selected word line WL1 is supplied with a verify voltage (refer to PV0 or PVN in FIG. 31), data (not shown) are read from the SLCs Me11 to Me1K or Mo11 to Mo1K. At this time, the verify voltage (PV0) can be set to be lower than a verify voltage (refer to PV1 in FIG. 31) and the verify voltage (PVN) can be set to a negative voltage. The predetermined voltage can be higher than or the same as the verify voltage (PV0 or PVN).

The page buffers PB1 to PBK generates the verify data (LVD1 to LVDK) based on the read data. This will be described in more detail.

The lower bit register 230 of each of the page buffers PB1 to PBK senses a voltage of the sensing node SO, which is decided according to the read data, in response to the read control signal (LREAD2) and stores the lower sensing data (SL2b) depending on the sensing result.

For example, when the read data are logic "1" (i.e., a threshold voltage of a corresponding SLC is higher than the verify voltage (PV0 or PVN)), the lower bit register 230 stores the lower sensing data (SL2b) of logic "0" 의 (i.e., the inverted lower sensing data (SL2) of logic "1"). Meanwhile, when the read data are logic "0" (i.e., a threshold voltage of a corresponding SLC is lower than the verify voltage (PV0 or PVN)), the lower bit register 230 maintains the storage state of the lower sensing data (SL1) of logic "0" (i.e., an initialization state).

The lower sensing data (SL1) of logic "0", which are stored in the lower bit register 230, are used as program data in a subsequent program step (604').

The second verify circuit 260 of each of the page buffers PB1 to PBK generates verify data (one of LVD1 to LVDK) in response to the lower sensing data (SL1) or the inverted lower sensing data (SL2) received from the lower bit register 230.

For example, the second verify circuit 260 can generate verify data (one of LVD1 to LVDK) of logic "1" in response to the lower sensing data (SL1) and can generate verify data (one of LVD1 to LVDK) of logic "0" in response to the inverted lower sensing data (SL2).

Thereafter, a data compare circuit (not shown) determines whether each of the verify data (LVD1 to LVDK) is logic "1". SLCs (e.g., Me11 to Me15 or Mo11 to Mo15), which correspond to the verify data (e.g., LVD1 to LVD5) of logic "1", are determined to have threshold voltages lower than a predetermined voltage.

Furthermore, SLCs (e.g., Me16 to Me1K or Mo16 to Mo1K) corresponding to the verify data (e.g., LVD6 to LVDK) which are not logic "1" are determined to have threshold voltages higher than the predetermined voltage.

As a result, SLCs Me11 to Me15 or Mo11 to Mo15, each having threshold voltages lower than the predetermined voltage, of the SLCs Me11 to Me1K or Mo11 to Mo1K are filtered in the step (603').

As the selected word line WL1 is supplied with a pre-program voltage (VPE) higher than the start program voltage (VSA), the selected SLCs Me11 to Me15 or Mo11 to Mo15 are programmed (604'). The pre-program voltage (VPE) can be set to be higher than the start program voltage (VSA) and can be set to be lower than or the same as the highest program voltage (refer to VSLF in FIG. 28).

Meanwhile, when the selected SLCs Me11 to Me15 or Mo11 to Mo15 are programmed, program into non-selected SLCs Me16 to Me1K or Mo16 to Mo1K is prohibited (605')

Thereafter, program voltages (VSL1 to VSLF) (F is an integer) that gradually increase from the start program voltage (VSA) at the ratio of the step voltage (VS) are sequentially applied to the selected word line WL1, the SLCs Me11 to Me1K or Mo11 to Mo1K are additionally programmed (606').

Figure 29:
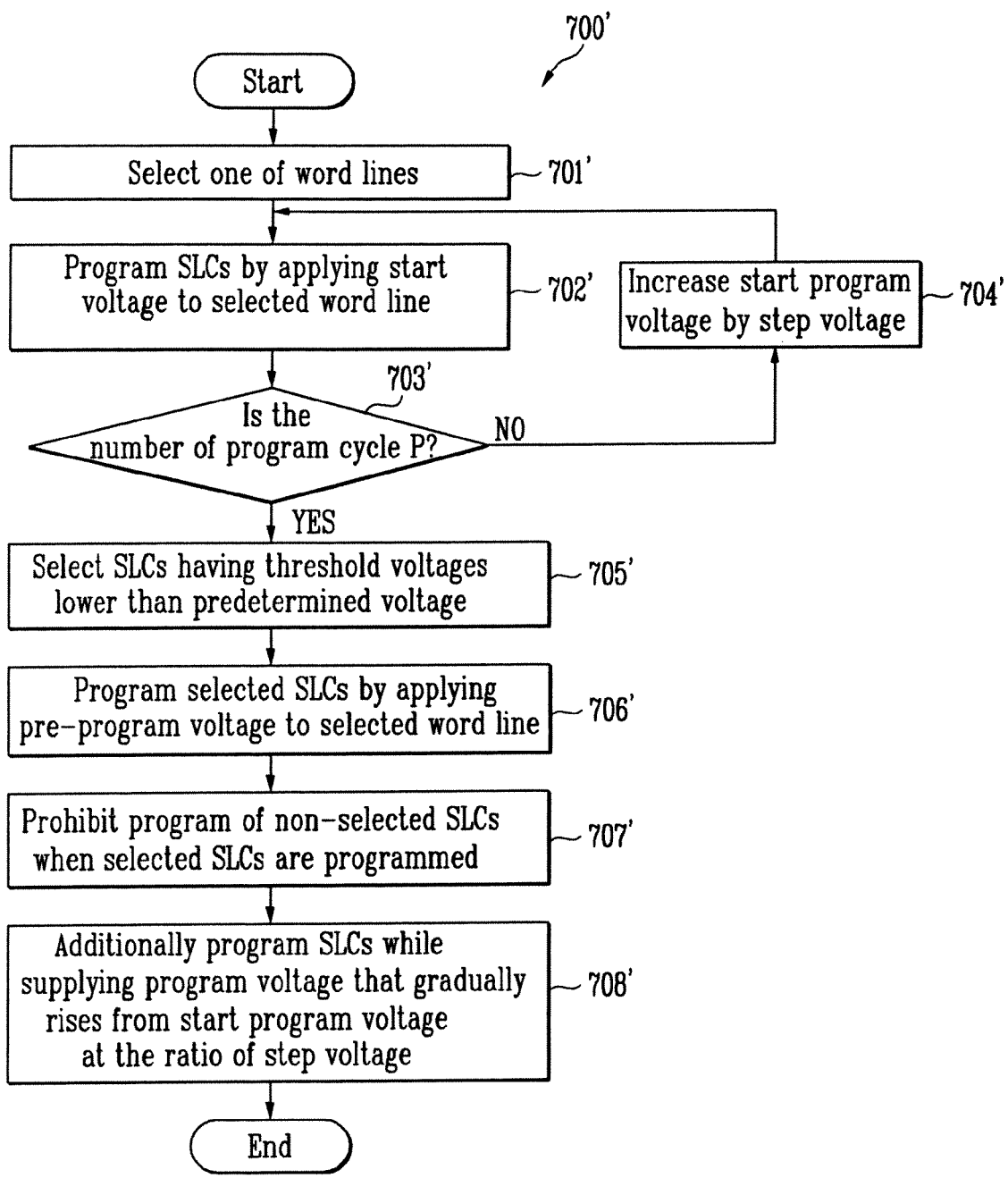
FIG. 29 is a flowchart illustrating a program method according to a fourth embodiment of the present invention.
Figure 30:
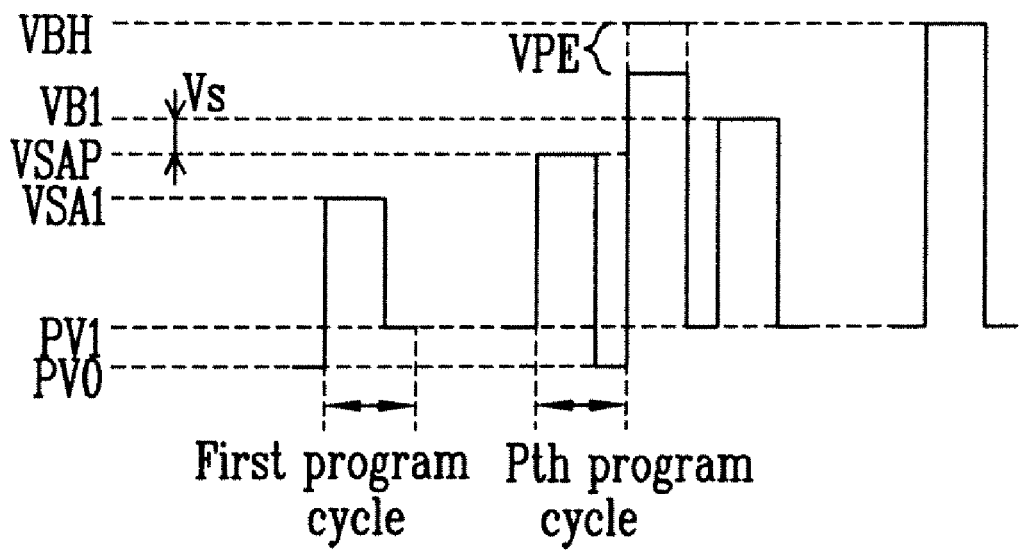
FIG. 30 is a view showing variation in a voltage applied to a word line in a program method according to a fourth embodiment of the present invention.

FIG. 29 is a flowchart illustrating a program method according to a fourth embodiment of the present invention. This method is concerned with program of SLCs.

One (e.g., WL1) of the word lines WL1 to WLJ is selected (701'). As a start program voltage (refer to VSA1 in FIG. 30) is applied to the selected word line WL1, the SLCs Me11 to Me1K or Mo11 to Mo1K connected to the word line WL1 are programmed (702').

Thereafter, it is determined whether the number of program cycles, which is being executed, is P (703'). If the number of program cycles, which is being executed, is not P in the step (703'), the start program voltage (VSA1) is increased as much as the step voltage (VS) (704'). As a result, the word line WL1 is supplied with a start program voltage (VSA2) that has risen from the start program voltage (VSA1) as much as the step voltage (VS).

Thereafter, the steps (701' to 704') are repeatedly executed until the number of the program cycle becomes P. When the number of the program cycle becomes P, SLCs (e.g., Me11 to Me15 or Mo11 to Mo15), each having threshold voltages lower than a predetermined voltage, of the SLCs Me11 to Me1K or Mo11 to Mo1K, are selected (705').

As the selected word line WL1 is supplied with the pre-program voltage (VPE), the selected SLCs Me11 to Me15 or Mo11 to Mo15 are programmed (706'). The pre-program voltage (VPE) can be set to be higher than a start program voltage (refer to VAP in FIG. 30) and to be lower than or the same as the highest program voltage (refer to VBH in FIG. 30) (H is an integer).

Meanwhile, when the selected SLCs Me11 to Me15 or Mo11 to Mo15 are programmed, program into non-selected SLCs Me16 to Me1K or Mo16 to Mo1K is prohibited (707').

Thereafter, as the program voltages (VB1 to VBH) that gradually rise from the start program voltage (VAP) at the ratio of the step voltage (VS) are sequentially applied to the selected word line WL1, the SLCs Me11 to Me1K or Mo11 to Mo1K are additionally programmed (708').

The steps (705' to 708') are the same as the steps (603 to 606), which have been described with reference to FIG. 27. Description thereof will be omitted.

As described above, in the program method according to the present invention, selected SLCs are pre-programmed by selecting only SLCs having threshold voltages lower than a predetermined voltage (i.e., SLCs having a slow program speed) and applying a pre-program voltage higher than a program voltage, which has been previously applied, to a word line. It is thus possible to shorten an overall program time.

Figure 32:
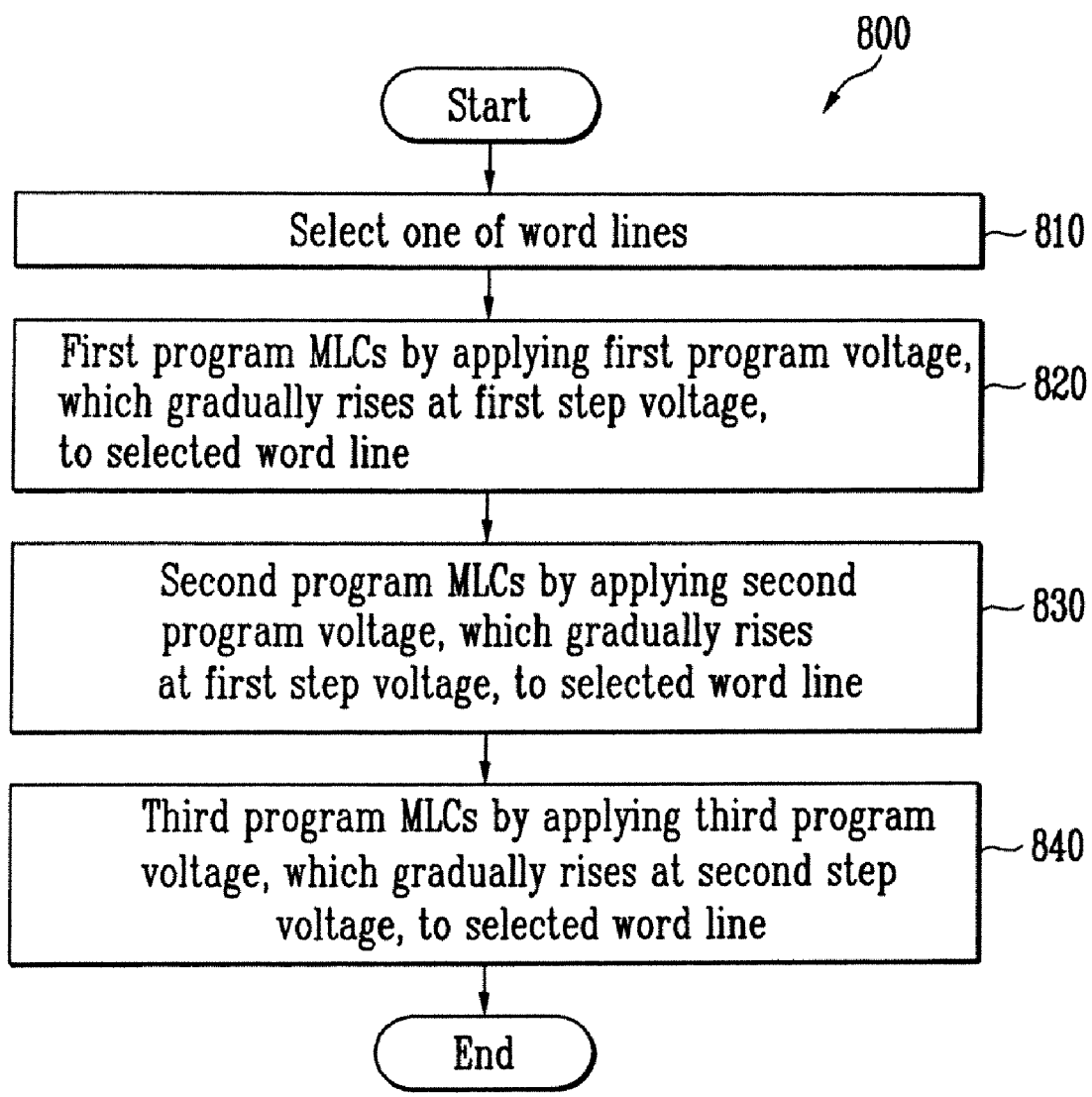
FIG. 32 is a flowchart illustrating a program method according to a fifth embodiment of the present invention.

FIG. 32 is a flowchart illustrating a program method according to a fifth embodiment of the present invention.

Figure 36:
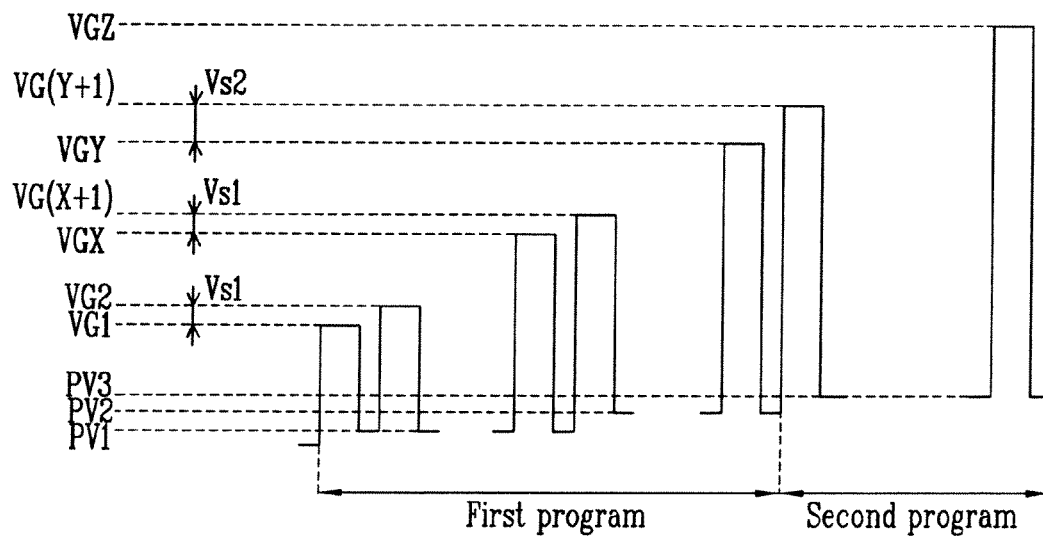
FIG. 36 is a view showing variation in a voltage applied to a word line in a program method according to a fifth embodiment of the present invention.

One (e.g., WL1) of the word lines WL1 to WLJ is selected (810). As first program voltages (VG2 to VGX) (X is an integer) (refer to Vs1 in FIG. 36), which gradually increase from a start program voltage (VG1) at the ratio of a first step voltage (refer to Vs1 in FIG. 36) (e.g., 0.2V), are sequentially applied to the selected word line WL1, the MLCs Me11 to Me1K or Mo11 to Mo1K are first programmed (820).

Thereafter, second program voltages (VG(X+1) to VGY) (Y is an integer) (refer to FIG. 36), which gradually increase from a first program voltage (VGX) that has finally risen in the first program step (820) at the ratio of the first step voltage (Vs1), are sequentially applied to the selected word line WL1, the MLCs Me11 to Me1K or Mo11 to Mo1K are second programmed (830).

Thereafter, third program voltages (VG(Y+1) to VGZ) (Z is an integer) (refer to FIG. 36), which gradually increase from a program voltage (VGY) that has finally risen in the second program step (830) at the ratio of a second step voltage (refer to Vs2 in FIG. 36) (e.g., 0.5V), are sequentially applied to the selected word line WL1, the MLCs Me11 to Me1K or Mo11 to Mo1K are second programmed (840).

The second step voltage (Vs2) (e.g., 0.5V to 0.95V) can be set to be higher than the first step voltage (Vs1) (e.g., 0.1V to 0.3V). Alternately, the first step voltage (Vs1) can be set to be higher than the second step voltage (Vs2).

Figure 31:
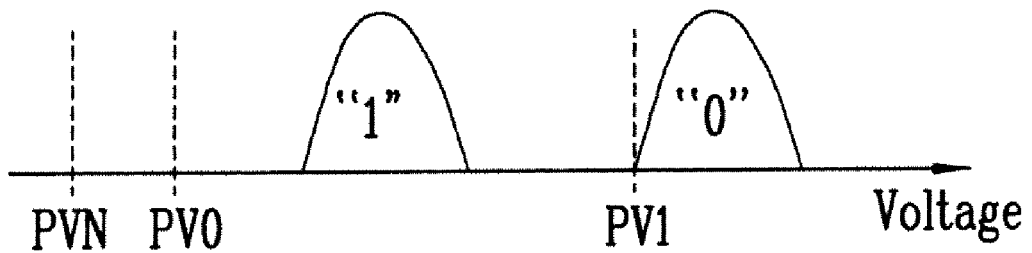
FIG. 31 is a view showing the relationship between the verify voltages and threshold voltage of MLCs shown in FIGS. 28 and 30.
Figure 33:
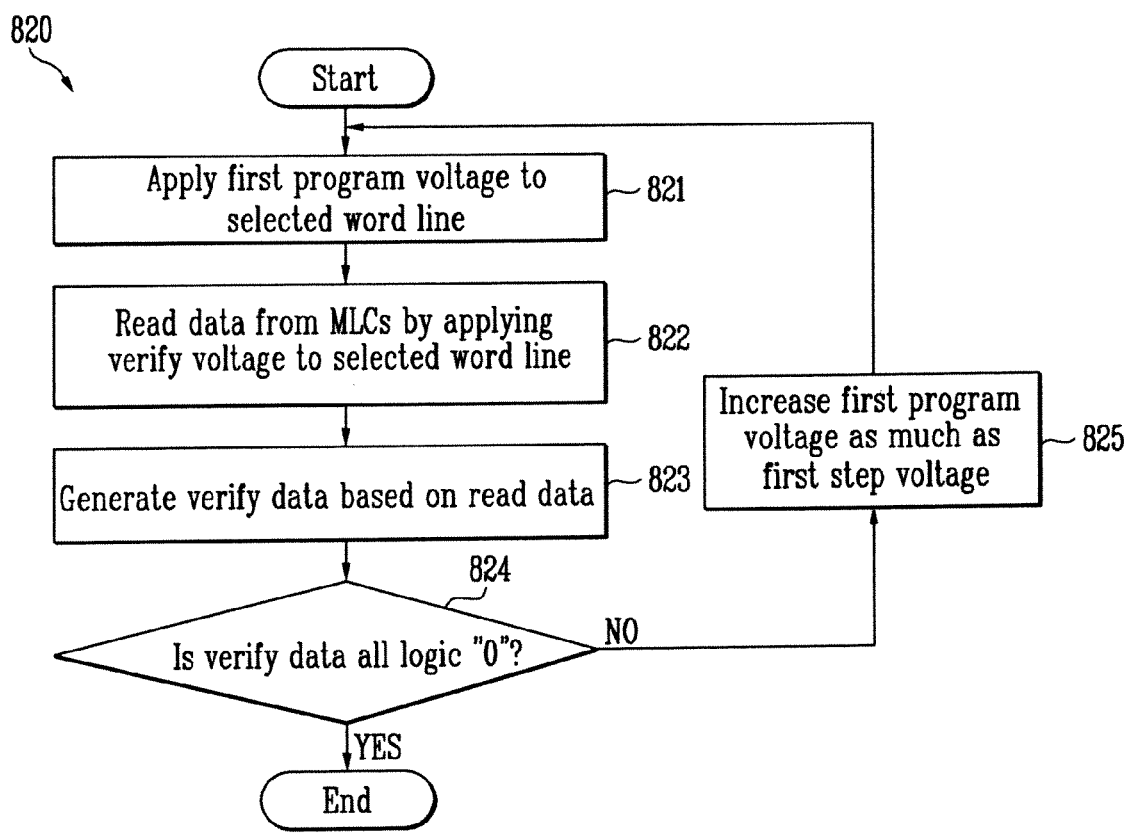
FIG. 33 is a detailed flowchart illustrating the process (820) shown in FIG. 31.

FIG. 33 is a detailed flowchart illustrating the process (820) shown in FIG. 31.

The selected word line WL1 is supplied with the first program voltage (VG1) (821). Thereafter, as the word line WL1 is supplied with the verify voltage (PV1), data (not shown) are read from the MLCs Me11 to Me1K or Mo11 to Mo1K (822).

The page buffers PB1 to PBK generates the verify data (LVD1 to LVDK), respectively, based on the read data (823).

A data compare circuit determines whether the verify data (LVD1 to LVDK) are all logic "0" (824).

If the verify data (LVD1 to LVDK) are not all logic "0" in the step (824), the first program voltage (VG1) is increased as much as the first step voltage (Vs1) (825).

Thereafter, the first program voltage (VG2) that has increased in the step (825) is supplied to the word line WL1, and the steps (821 to 825) are repeatedly performed.

Meanwhile, if the verify data (LVD1 to LVDK) are all logic "0" in the step (824), the first program process (820) is finished and the second program process (830) begins.

The operation of the page buffers PB1 to PBK in the steps (821 to 825) is the same as that of the page buffers PB1 to PBK in the steps (621 to 625), which have been described with reference to FIG. 20. Description thereof will be omitted.

Figure 34:
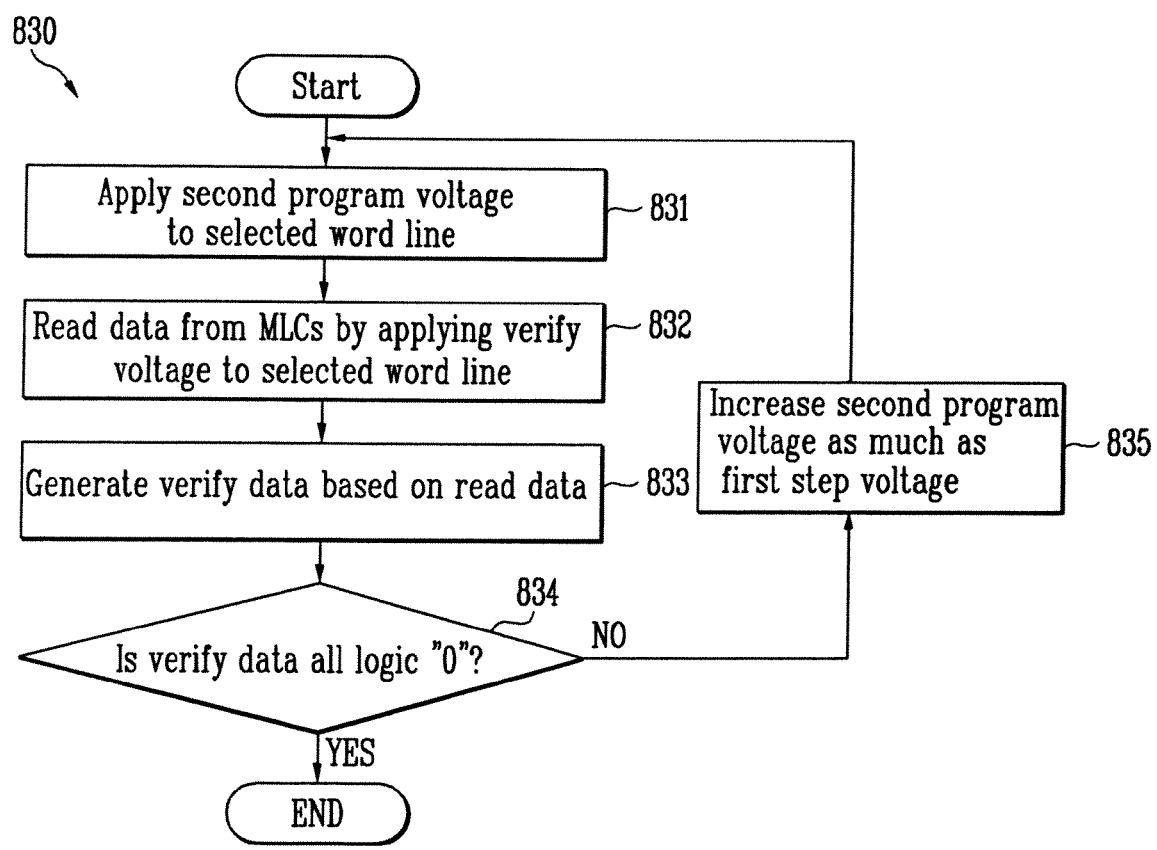
FIG. 34 is a detailed flowchart illustrating the process (830) shown in FIG. 31.

FIG. 34 is a detailed flowchart illustrating the process (830) shown in FIG. 31.

A second program voltage (VG(X+1)), which is the first step voltage (Vs1) higher than the first program voltage (VGX) that has finally risen in the step (820), is applied to the selected word line WL1 (831).

Thereafter, as the word line WL1 is supplied with a verify voltage (PV2) higher than the verify voltage (PV1), data (not shown) are read from the MLCs Me11 to Me1K or Mo11 to Mo1K (832). The page buffers PB1 to PBK generate verify data (MVD1 to MVDK), respectively, based on the read data (833).

A data compare circuit determines whether the verify data (MVD1 to MVDK) are all logic "0" (834).

If the verify data (MVD1 to MVDK) are not all logic "0" in the step (834), the second program voltage (VG(X+1)) is increased as much as the first step voltage (Vs1) (835).

Thereafter, the second program voltage (VG(X+2)) that has risen in the step (835) is supplied to the word line WL1. The steps (831 to 835) are repeatedly executed.

Meanwhile, if the verify data (MVD1 to MVDK) are all logic "0" in the step (834), the second program process (830) is finished and the third program process (840) begins.

The operation of the page buffers PB1 to PBK in the steps (831 to 835) is the same as that of the page buffers PB1 to PBK in the steps (631 to 635), which have been described with reference to FIG. 21. Description thereof will be omitted for simplicity.

Figure 35:
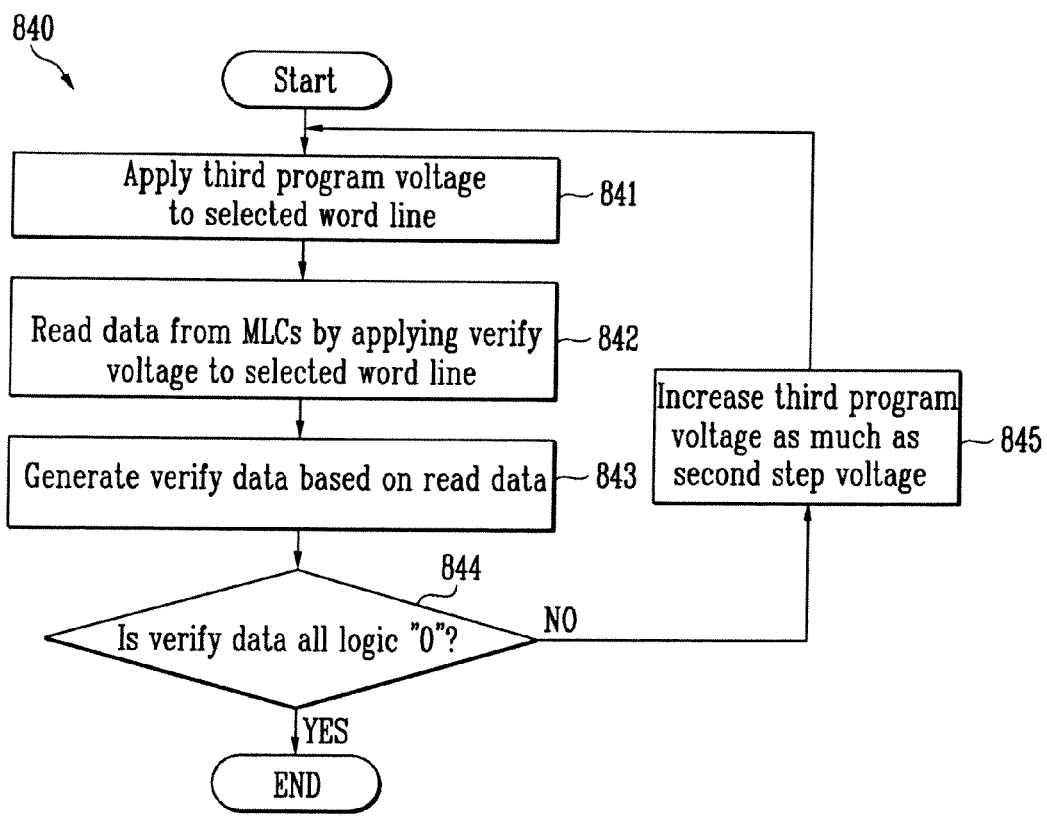
FIG. 35 is a detailed flowchart illustrating the process (840) shown in FIG. 31.

FIG. 35 is a detailed flowchart illustrating the process (840) shown in FIG. 31.

A third program voltage (VG(Y+1)), which is the second step voltage (Vs2) higher than the second program voltage (VGY) that has finally risen in the step (830) is applied to the selected word line WL1 (841).

As the word line WL1 is supplied with a verify voltage (PV3) higher than the verify voltage (PV2), data (not shown) are read from the MLCs Me11 to Me1K or Mo11 to Mo1K (842). The page buffers PB1 to PBK generate verify data (LVD1 to LVDK), respectively, based on the read data (843).

A data compare circuit determines whether the verify data (LVD1 to LVDK) are all logic "0" (844). If the verify data (LVD1 to LVDK) are not all logic "0" in the step (844), the third program voltage (VG(Y+1)) is increased as much as the second step voltage (Vs2) (845).

Thereafter, a third program voltage (VG(Y+2)) that has risen in the step (845) is applied to the word line WL1. The steps (841 to 845) are repeatedly performed.

Meanwhile, Ii the verify data (LVD1 to LVDK) are all logic "0" in the step (844), the third program process (840) is finished. The operation of the page buffers PB1 to PBK in the steps (841 to 845) is the same as that of the page buffers PB1 to PBK in the steps (641 to 645), which have been described with reference to FIG. 22. Description thereof will be omitted.

If the step voltage in the first and second program processes (i.e., the process in which data "10" or "00" are programmed into MLCs) is set to be higher than the step voltage in the third program process (i.e., the process in which data "01" are programmed into the MLC) as described above, an overall program time can be shortened. Furthermore, in the first and second program processes, MLCs can be prevented from being over-programmed by a high program voltage.

As described above, in the erase process according to the present invention, MLCs are pre-programmed so that a voltage range in which threshold voltages of the MLCs are distributed is reduced. Therefore, a fail occurrence ratio when erasing the MLCs can be reduced and threshold voltage distribution of the MLCs can be improved. It is thus possible to reduce an overall program time in a subsequent program operation.

Furthermore, in the program method according to the present invention, only MLCs having a slow program speed are selected and programmed, and the program process of the ISPP method is then performed. This results in a reduced overall program time.

Furthermore, in the program method according to the present invention, step voltages (i.e., an increment width of a program voltage) before threshold voltages of MLCs become a predetermined verify voltage and after the threshold voltages of the MLCs become the predetermined verify voltage are set to be different from each other in the program process of the ISPP method. It is thus possible to reduce an overall program time.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. An erase method of a flash memory device including a plurality of Multi Level Cells (MLCs) that share word lines and bit lines, the erase method comprising the steps of:
   selecting MLCs of the plurality of MLCs connected to a selected word line, wherein each of the plurality of the MLCs has a threshold voltage included in one of first to fourth voltage ranges and each of the selected MLCs has a threshold voltage included in the first voltage range;
   pre-programming the selected MLCs so that the threshold voltages of the selected MLCs are moved from the first voltage range to the fourth voltage range, wherein non-selected MLCs of the plurality of the MLCs are prohibited from being pre-programmed when the selected MLCs are pre-programmed;
   erasing the plurality of MLCs after performing the pre-programming step; and
   verifying whether the plurality of MLCs has been normally erased,
   wherein the pre-programming step is performed in the first place, and;

wherein a highest voltage of the first voltage range is lower than a lowest voltage of the second voltage range, a highest voltage of the second voltage range is lower than a lowest voltage of the third voltage range, and a highest voltage of the third voltage range is lower than a lowest voltage of the fourth voltage range.

2. The erase method as claimed in claim 1, wherein the pre-programming step includes the steps of:
determining whether some of the MLCs connected to the selected word line have been programmed;
repeating the selection step, the pre-program step, and the determination step until some of the MLCs connected to the selected word line are programmed; and
repeatedly performing the selection step, the pre-programming step, the determination step, and the repetition step until some of the MLCs connected to a last word line, of the plurality of MLCs, are programmed.

3. The erase method as claimed in claim 1, wherein the step of selecting the MLCs includes the steps of:
reading data from the MLCs connected to the selected word line by applying a verify voltage, which is higher than the highest voltage of the first voltage range and is lower than or the same as the lowest voltage of the second voltage range, to the selected word line;
generating verify data based on the read data; and
filtering MLCs whose threshold voltages are included in the first voltage range, of the MLCs connected to the selected word line, according to logic values of the verify data,
wherein in the step of generating the verify data, sensing data generated based on some of the read data are stored in page buffers, respectively, which are connected to the filtered MLCs, as program data through some of the bit lines.

4. The erase method as claimed in claim 2, wherein the program step includes the steps of:
programming the selected MLCs so that the threshold voltages of the selected MLCs are moved to the second voltage range;
additionally selecting MLCs respectively having threshold voltages included in the second voltage range, of the plurality of MLCs;
additionally programming the additionally selected MLCs so that the threshold voltages of the additionally selected MLCs are moved to the third voltage range; and
prohibiting program into the remaining MLCs other than the additionally selected MLCs when the additionally selected MLCs are additionally programmed.

5. The erase method as claimed in claim 4, wherein the step of selecting the MLCs includes the steps of:
reading data from the MLCs connected to the selected word line by applying a verify voltage, which is higher than the highest voltage of the first voltage range and is lower than or the same as the lowest voltage of the second voltage range, to the selected word line;
generating verify data based on the read data; and
filtering MLCs whose threshold voltages are included in the first voltage range, of the MLCs connected to the selected word line, according to logic values of the verify data,
wherein in the step of generating the verify data, sensing data generated based on some of the read data are stored in page buffers, respectively, which are connected to the filtered MLCs, as program data through some of the bit lines.

6. The erase method as claimed in claim 4, wherein the step of additionally selecting the MLCs includes the steps of:
reading data from the MLCs connected to the selected word line by applying a verify voltage, which is higher than the highest voltage of the second voltage range and is lower than or the same as the lowest voltage of the third voltage range, to the selected word line;
generating verify data based on the read data; and
filtering MLCs whose threshold voltages are included in the second voltage range, of the MLCs connected to the selected word line, according to logic values of the verify data,
wherein in the step of generating the verify data, sensing data generated based on some of the read data are stored in page buffers, respectively, which are connected to the filtered MLCs, as program data through some of the bit lines.

7. The erase method as claimed in claim 4, wherein the verify step includes the steps of:
initializing an upper bit register and a lower bit register of each of page buffers connected to the MLCs, which are connected to the selected word line, through the bit lines;
reading data from the MLCs connected to the selected word line by applying an erase verify voltage to the selected word line;
storing lower sensing data in the lower bit registers of the page buffers based on the read data;
transferring initial data, which are stored in an upper bit register of each of page buffers connected to repaired MLCs of the MLCs connected to the selected word line, to the lower bit registers;
generating verify data based on the lower sensing data or the initial data, which are respectively stored in the lower bit registers of the page buffers; and
determining whether the erase of the MLCs connected to the selected word line is fail depending on logic values of the verify data.

8. The erase method as claimed in claim 1, further comprising the step of post-programming the plurality of MLCs so that threshold voltages of over-erased MLCs, of the plurality of MLCs, are included in a predetermined voltage range, between the erase step and the verify step.

9. The erase method as claimed in claim 8, wherein the pre-program step includes the steps of:
determining whether some of the MLCs connected to the selected word line have been programmed;
repeating the selection step, the program step and the determination step until some of the MLCs connected to the selected word line are programmed; and
repeatedly performing the selection step to the repetition step until some of the MLCs connected to a last word line, of the plurality of MLCs, are programmed.

10. The erase method as claimed in claim 9, wherein the program step includes the steps of:
selecting MLCs respectively having threshold voltages included in the first voltage range of the first to fourth voltage ranges, of the MLCs connected to the selected word line;
programming the selected MLCs so that the threshold voltages of the selected MLCs are moved to the fourth voltage range;
prohibiting program into the remaining MLCs other than the selected MLCs when the selected MLCs are programmed;
additionally selecting MLCs respectively having threshold voltages included in the second voltage range, of the plurality of MLCs;

additionally programming the additionally selected MLCs so that the threshold voltages of the additionally selected MLCs are moved to the third voltage range; and prohibiting program into the remaining MLCs other than the additionally selected MLCs when the additionally selected MLCs are additionally programmed.

11. The erase method as claimed in claim 10, wherein the step of selecting the MLCs includes the steps of:

reading data from the MLCs connected to the selected word line by applying a verify voltage, which is higher than the highest voltage of the first voltage range and is lower than or the same as the lowest voltage of the second voltage range, to the selected word line;

generating verify data based on the read data; and filtering MLCs whose threshold voltages are included in the first voltage range, of the MLCs connected to the selected word line, according to logic values of the verify data, wherein in the step of generating the verify data, sensing data generated based on some of the read data are stored in page buffers, respectively, which are connected to the filtered MLCs, as program data through some of the bit lines.

12. The erase method as claimed in claim 10, wherein the step of additionally selecting the MLCs includes the steps of:

reading data from the MLCs connected to the selected word line by applying a verify voltage, which is higher than the highest voltage of the second voltage range and is lower than or the same as the lowest voltage of the third voltage range, to the selected word line;

generating verify data based on the read data; and filtering MLCs whose threshold voltages are included in the second voltage range, of the MLCs connected to the selected word line, according to logic values of the verify data, wherein in the step of generating the verify data, sensing data generated based on some of the read data are stored in page buffers, respectively, which are connected to the filtered MLCs, as program data through some of the bit lines.

* * * * *